United States Patent
Paul et al.

(10) Patent No.: US 10,557,725 B2
(45) Date of Patent: Feb. 11, 2020

(54) MAGNETORESISTIVE WHEATSTONE MEASURING BRIDGE AND ANGLE SENSOR HAVING AT LEAST TWO SUCH MEASURING BRIDGES

(71) Applicant: SENSITEC GMBH, Lahnau (DE)

(72) Inventors: Johannes Paul, Mainz (DE); Golzar Alavi, Stuttgart (DE); Tsung-I Yin, Frankfurt (DE)

(73) Assignee: SENSITEC GMBH, Lahnau (DE)

( * ) Notice: Subject to any disclaimer, the term of this patent is extended or adjusted under 35 U.S.C. 154(b) by 300 days.

(21) Appl. No.: 15/528,464

(22) PCT Filed: Nov. 24, 2015

(86) PCT No.: PCT/EP2015/077571
§ 371 (c)(1),
(2) Date: May 19, 2017

(87) PCT Pub. No.: WO2016/083420
PCT Pub. Date: Jun. 2, 2016

(65) Prior Publication Data
US 2017/0322052 A1 Nov. 9, 2017

(30) Foreign Application Priority Data
Nov. 24, 2014 (DE) .................. 10 2014 117 160

(51) Int. Cl.
*G01D 5/16* (2006.01)
*G01R 33/00* (2006.01)
(Continued)

(52) U.S. Cl.
CPC .......... *G01D 5/16* (2013.01); *G01R 33/0005* (2013.01); *G01R 33/0023* (2013.01); *G01R 33/04* (2013.01); *G01R 33/09* (2013.01)

(58) Field of Classification Search
CPC .. G01D 5/16; G01R 33/0005; G01R 33/0023; G01R 33/04; G01R 33/09
(Continued)

(56) References Cited

U.S. PATENT DOCUMENTS 6,633,462 B2   10/2003   Adelerhof
2002/0006017 A1   1/2002   Adelerhof
(Continued)

FOREIGN PATENT DOCUMENTS

DE   4438715 C1   5/1996
DE   19839450 A1   3/2000
(Continued)

OTHER PUBLICATIONS

Office Action for Japanese Patent Application No. 2017-527568 dated Sep. 25, 2018.
(Continued)

*Primary Examiner* — Melissa J Koval
*Assistant Examiner* — Trung Nguyen
(74) *Attorney, Agent, or Firm* — Merchant & Gould P.C.

(57) ABSTRACT

A magnetoresistive Wheatstone bridge includes two bridge branches connected in parallel between a supply potential Vb, wherein two series-connected resistor arrangements R1 and R3 or R2 and R4 are arranged in each bridge branch with an interposed measuring potential Vout. The resistor arrangements of the two bridge branches are situated diagonally opposite one another and at least two magnetoresistive resistor arrangements have a magnetically sensitive preferred direction. The preferred directions of diagonally opposing resistor arrangements of the bridge branches R1 and R4 or R2 and R3 differ by an angle other than 0° or 180°. An angle sensor includes at least two of the Wheatstone bridges offset by a predefined angle for determining an angular orientation of a magnetic field by a sine bridge and a cosine bridge. The measuring bridge reduces harmonics and optimizes resistance values, improving the accuracy of a phase-angle sensor signal and the sensor resolution.

12 Claims, 14 Drawing Sheets

(51) Int. Cl.
*G01R 33/04* (2006.01)
*G01R 33/09* (2006.01)

(58) Field of Classification Search
USPC ........ 324/219–252, 200, 207.2–207.24, 500, 324/526–530, 750.12, 750.21, 754.17, 324/754.29, 443, 600, 610, 648–706, 725, 324/98; 257/84, 92, 423–427, 448, 494, 257/508, 587–588
See application file for complete search history.

(56) References Cited

U.S. PATENT DOCUMENTS

| | | | |
|---|---|---|---|
| 2006/0250146 | A1* | 11/2006 | Braun ................ G01L 1/2281 324/720 |
| 2008/0272771 | A1 | 11/2008 | Guo et al. |
| 2013/0099783 | A1 | 4/2013 | Kubik |
| 2015/0214727 | A1* | 7/2015 | Chen .................... H02J 3/01 363/56.02 |

FOREIGN PATENT DOCUMENTS

| | | |
|---|---|---|
| EP | 2455720 A1 | 5/2012 |
| JP | 2006-519370 A | 8/2006 |
| JP | 2014-071039 A | 4/2014 |
| JP | 2014-202704 A | 10/2014 |
| WO | 2004/074764 A2 | 9/2004 |

OTHER PUBLICATIONS

International Search Report for PCT/EP2015/077571 dated Feb. 23, 2016.

* cited by examiner

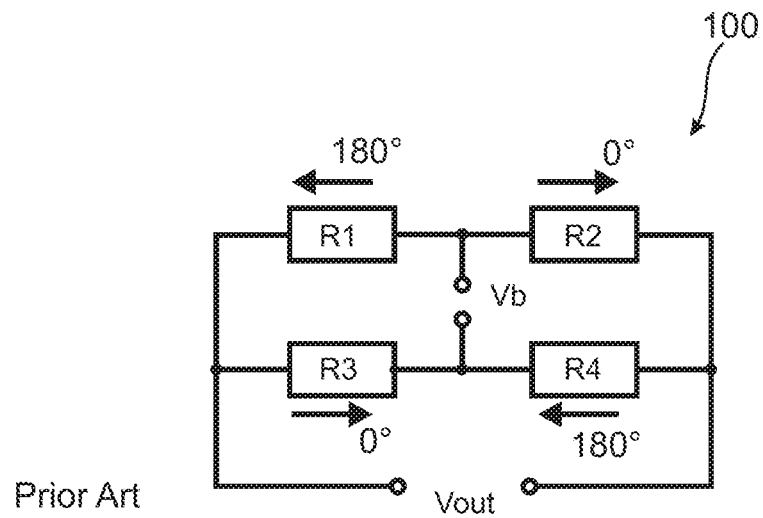
Prior Art
Fig.1
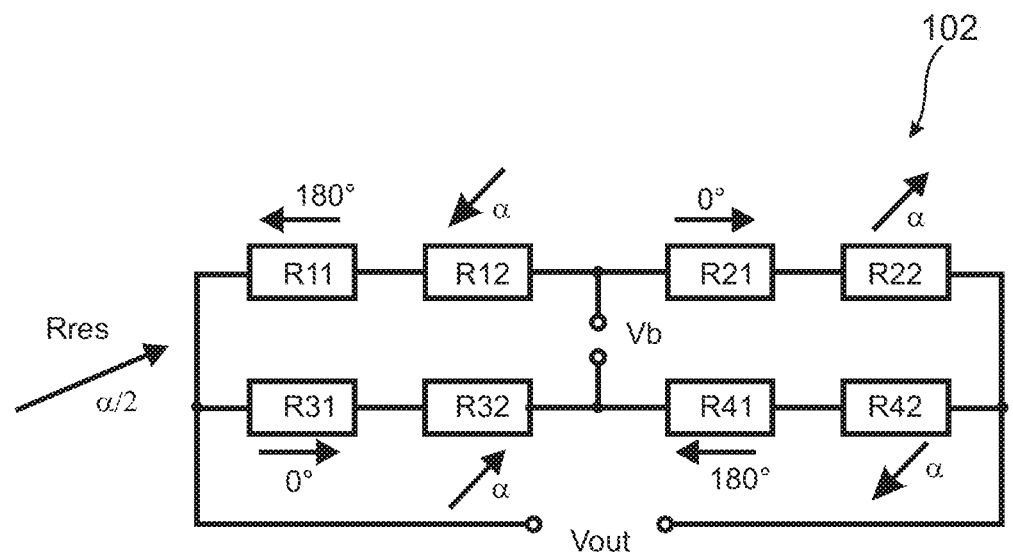
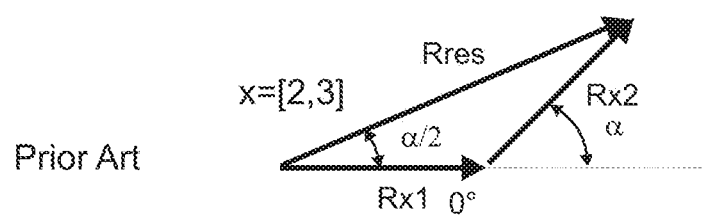
Prior Art
Fig.2

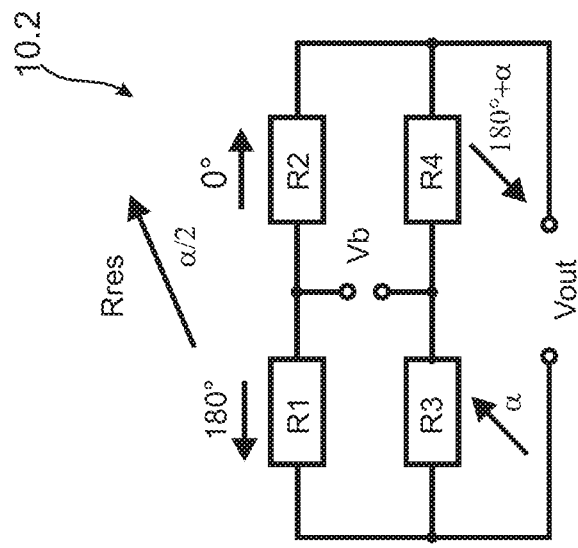
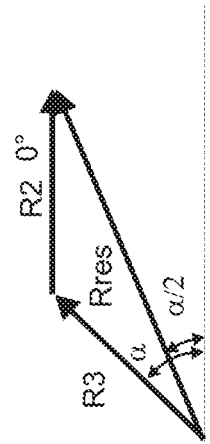
Fig.3b
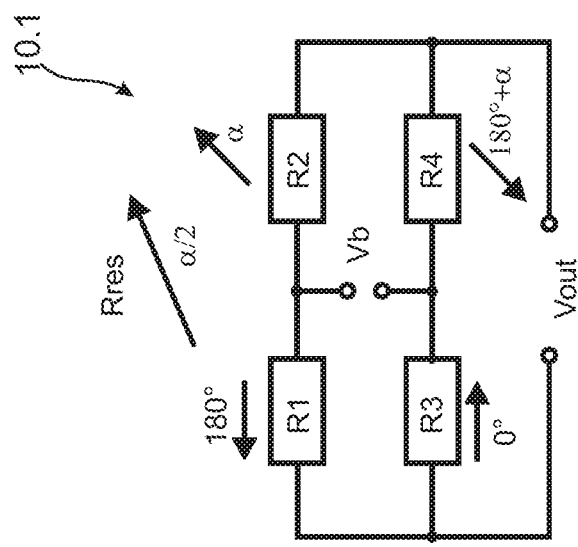
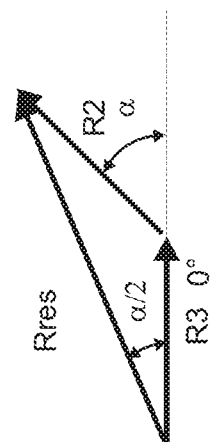
Fig.3a

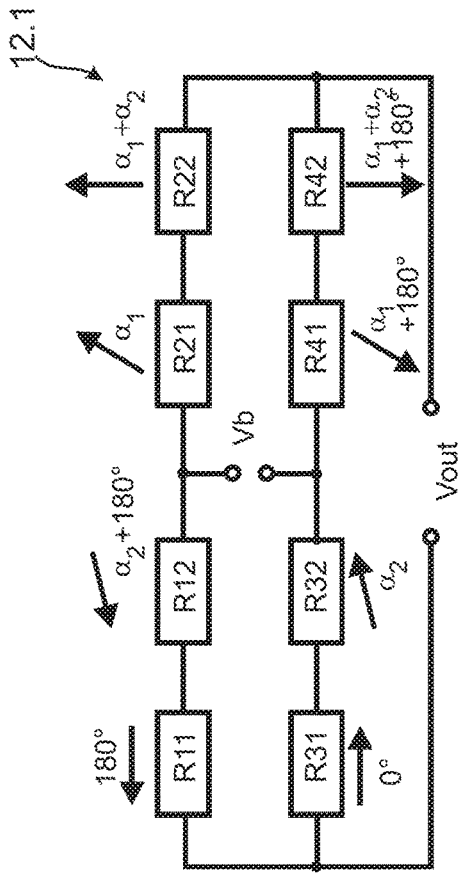
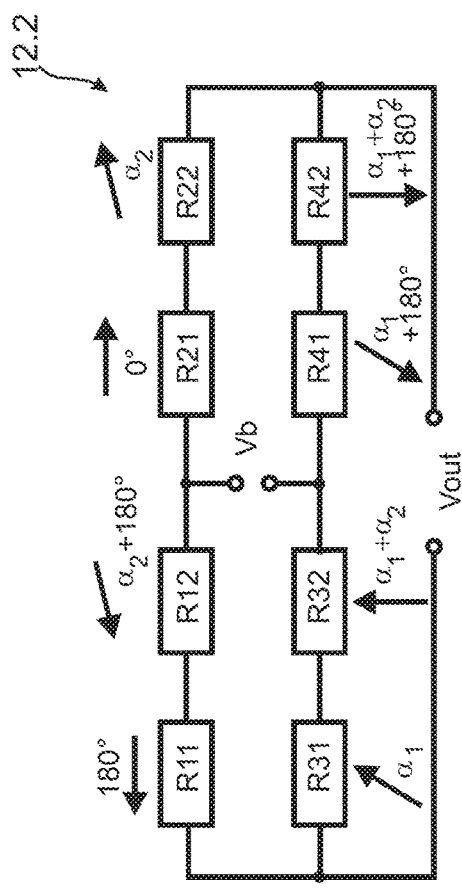
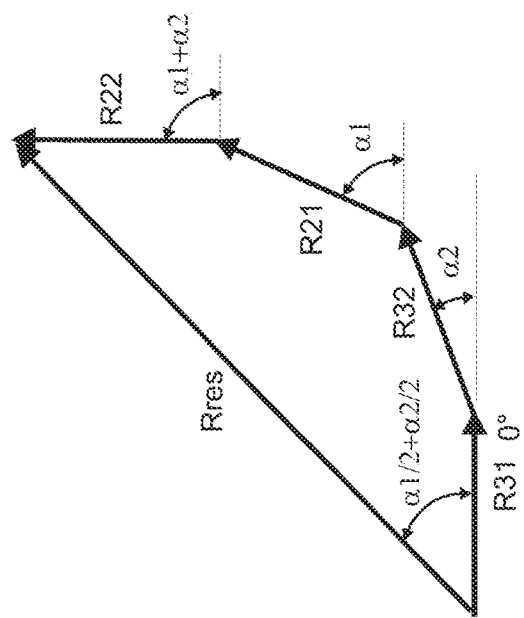
Fig.4a
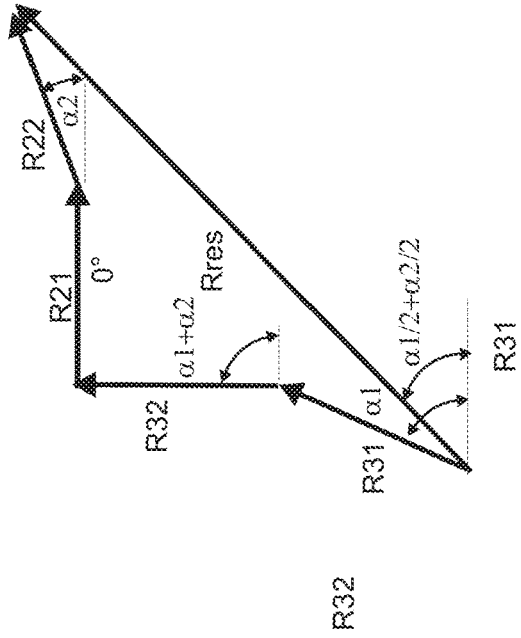
Fig.4b

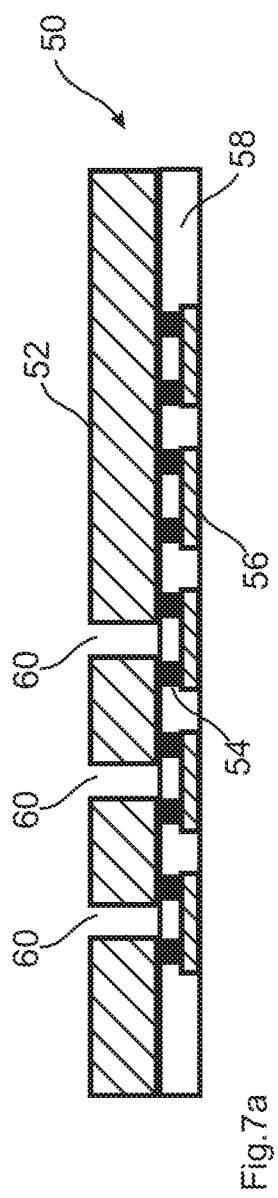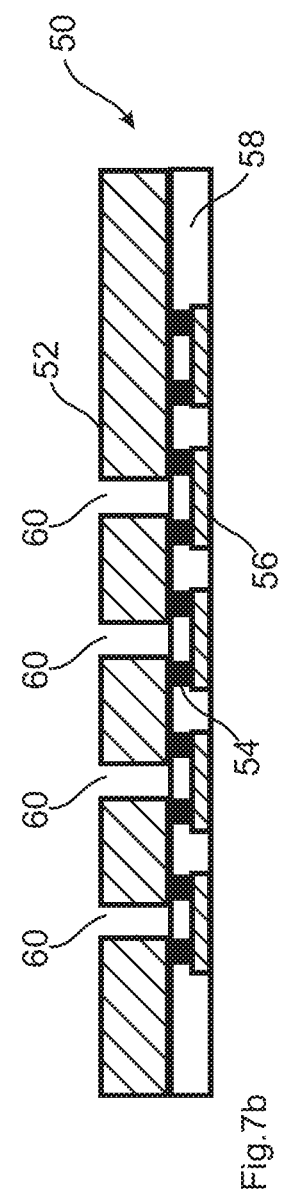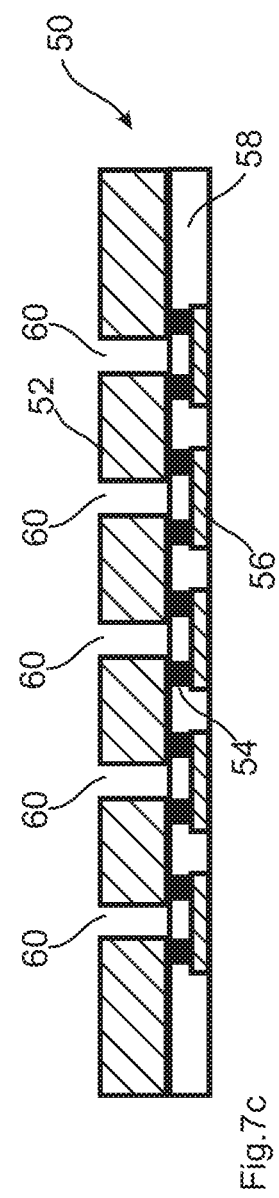

RT=2r

RT=4r

RT=4/3r

RT=r

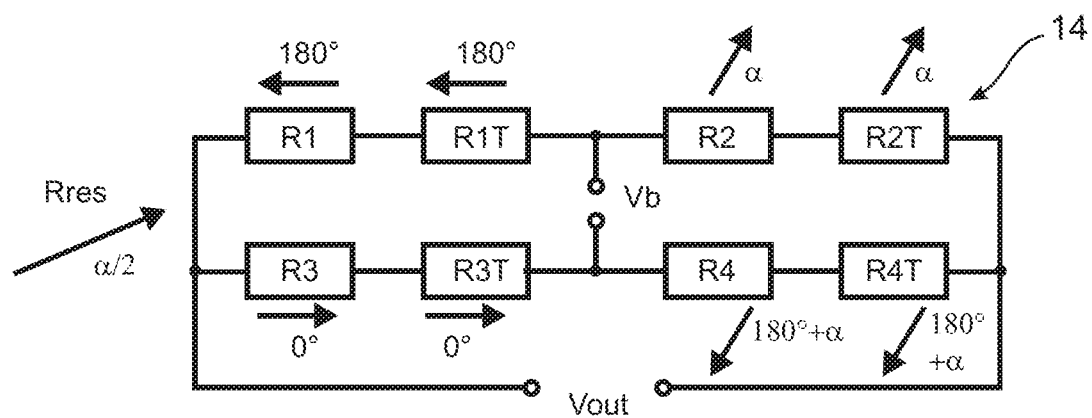
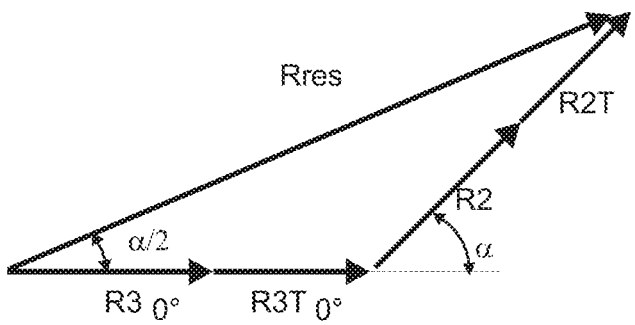
Fig. 9a
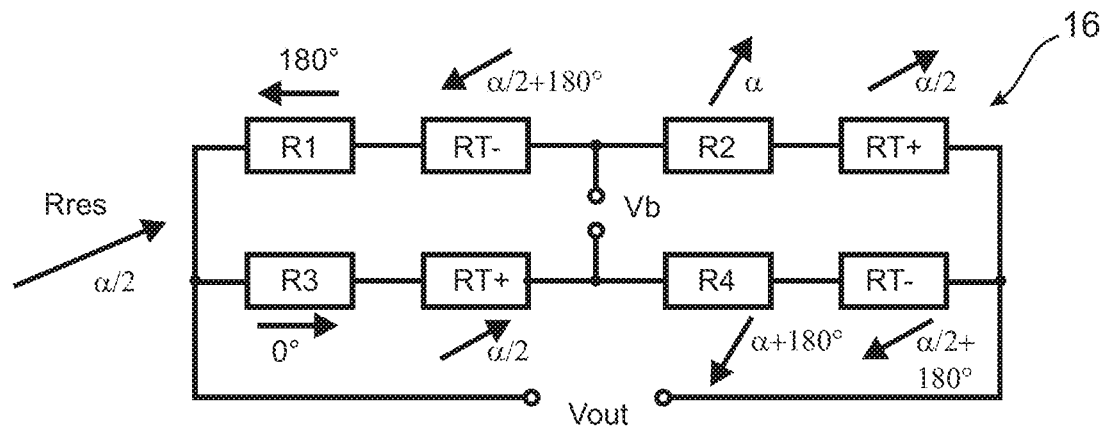
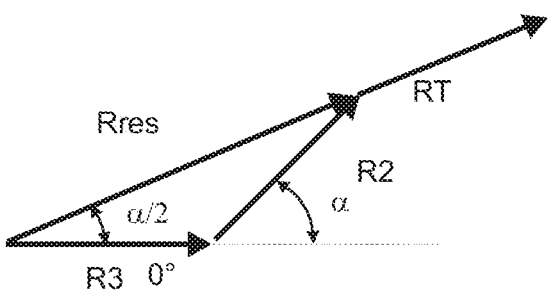
Fig. 9b

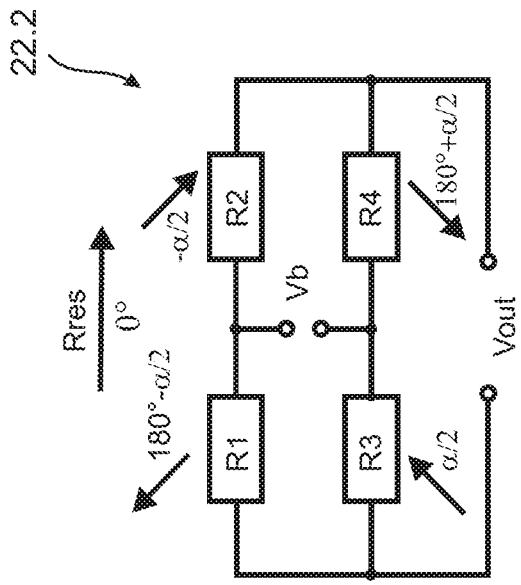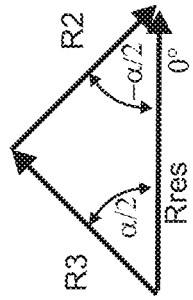
Fig. 11b
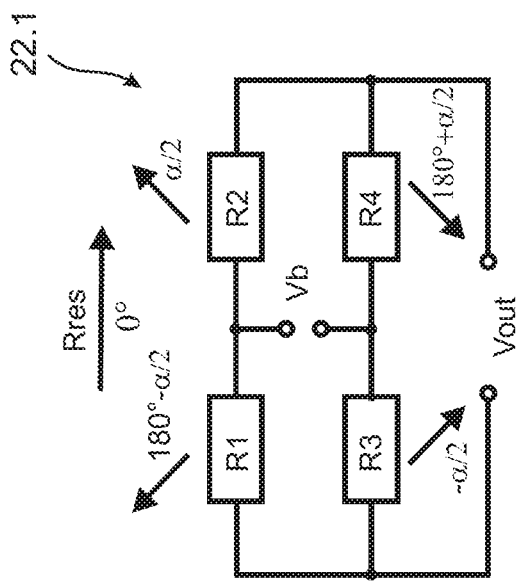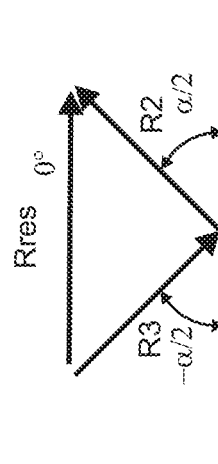
Fig. 11a

MAGNETORESISTIVE WHEATSTONE MEASURING BRIDGE AND ANGLE SENSOR HAVING AT LEAST TWO SUCH MEASURING BRIDGES

This application is a National Stage Application of International Patent Application No. PCT/EP2015/077571, filed Nov. 24, 2015, which claims benefit of German Patent Application No. 10 2014 117 160.8, filed Nov. 24, 2014 and which applications are incorporated herein by reference. To the extent appropriate, a claim of priority is made to each of the above disclosed applications.

The invention relates to a magnetoresistive Wheatstone bridge and a magnetoresistive angle sensor for measuring the angular orientation of a magnetic field, which comprises at least one Wheatstone bridge, preferably two or more Wheatstone bridges offset by a predefined angle according to the teaching of claim 1.

To this end, the two parallel-connected bridge branches of the Wheatstone bridge, which are also known as half-bridges, each comprise two series-connected magnetoresistive resistor arrangements R1 and R3 or R2 and R4. The resistor arrangements R1, R4 and R2, R3 of the two bridge branches are each situated diagonally opposite one another and the resistor arrangements R1, R2 or R3, R4 of the two bridge branches are situated in pairs opposite one another. Each resistor arrangement comprises a magnetically sensitive preferred direction, which may also be known as a sensitivity direction, in which a magnetic field is measurable with a maximum possible sensitivity.

The invention allows improved angle detection accuracy by means of a magnetic angle sensor.

FIELD OF THE INVENTION

Magnetoresistance effects are all effects which describe the change in the electrical resistance of a material caused by application of an external magnetic field. Magnetoresistance effects which have a preferred direction in respect of the vectorial direction of a magnetic field to be measured are in particular the anisotropic magnetoresistance effect (AMR effect), the giant magnetoresistance effect (GMR effect), the CMR effect, and the TMR effect.

In the prior art, magnetoresistive angle sensors are frequently configured as a Wheatstone bridge, wherein the same magnetoresistive resistance materials are used in each bridge branch, these differing from one another only in their shape or magnetic orientation. Through this arrangement, temperature independence of the output signal is achieved, since the temperature-dependent change in resistance in each bridge branch is identical and thus a temperature-related change does not have any effect on a sensor signal.

To obtain unambiguous angle information, two Wheatstone bridges are typically necessary which have their magnetic sensitivity direction in different orientations relative to one another. For example, the two bridges are rotated by 90° and a sine function and a cosine function are obtained in the bridge output in the event of a magnetic field to be detected rotating by the angle of rotation θ. These two signals are used to calculate an unambiguous angular position θ, for example by means of the ARCTAN function. In cases of different angular offsets of the two bridges, an unambiguous angular orientation of a magnetic field to be detected may likewise be calculated using suitable trigonometric functions.

AMR (anisotropic magnetoresistance effect) resistors have a resistance dependence which correlates with the angle between current direction and direction of magnetisation, since the periodicity amount to 180° in the case of AMR.

An AMR bridge for angle measurement therefore contains magnetoresistive strips in different directions. To obtain a phase-shifted signal with AMR, two bridges are used, which are rotated for example by 45° relative to one another.

GMR and TMR (giant magnetoresistance effect and tunnel magnetoresistance effect) resistors have a resistance dependence which correlates with the angle between the direction of magnetisation of the free layers and the direction of magnetisation of the pinned layers. The periodicity of the magnetic field direction dependence amounts to 360° in the case of TMR and/or GMR resistors. The pinned layer comprises a magnetic premagnetisation as pinning direction, which defines a preferred direction. The free layer and pinned layer are magnetic layers which are separated by a non-magnetic layer, in the case of TMR a thin insulator, for example $Al_2O_3$ or MgO, and in the case of GMR a thin, conductive layer, for example Cu or Ru. The free layer is configured such that its direction of magnetisation follows the external field, while the pinned layer is configured such that its direction of magnetisation as far as possible remains stable when an external field is applied.

AMR-, TMR- or GMR-based resistors in Wheatstone bridges, which have a definable preferred direction for detection of a rotating magnetic field, may be used for the purposes of the invention since all these types of magnetoresistive resistors have a magnetoresistive preferred direction in which a change in the magnitude of an external magnetic field brings about a maximally large change in resistance, i.e. in which the highest magnetoresistive sensitivity prevails. In a Wheatstone bridge this preferred direction may be defined in process engineering on production of the sensor layout at chip level or by an electrical and/or magnetic configuration.

FIG. 1 shows a typical Wheatstone bridge of GMR- or TMR-sensors, which comprises opposing, i.e. antiparallel, preferred directions in the individual bridge branches. The four magnetoresistive bridge resistors have an identical nominal resistance magnitude and form two bridge branches with series-connected bridge resistor arrangements R1 and R3 and bridge resistor arrangements R2 and R4 parallel thereto, which lie between the supply potential difference Vb. As a rule, a bridge resistor arrangement corresponds to an individual bridge resistor; however a bridge resistor arrangement may also comprise two or more individual series or parallel bridge resistors. The output voltage Vout may be tapped at the centre taps between the bridge branches R1/R3 or R2/R4. The arrows shown may for example indicate the pinning direction of GMR- or TMR-resistors and thus identify the magnetoresistive preferred direction thereof. All the bridge resistors of a bridge resistor arrangement have an identical magnetic preferred direction. In the case of TMR- or GMR-resistors, the resistance is at its minimum when the free layer and pinning layer are magnetised in the same direction and at its maximum in the case of antiparallel magnetisation. The bridge resistor arrangements of a bridge branch have antiparallel preferred directions and the diagonally situated bridge resistor arrangements of the two bridge branches have identical preferred directions, i.e. R1 and R4 have the same preferred direction and R2 and R3 have a preferred direction offset by 180° therefrom. An external magnetic field oriented in the preferred direction of the bridge resistor arrangements R2, R3 brings about resistance minimisation in resistors R2 and R3 and a resistance maximisation in resistors R1 and R4, so resulting in a maximum or minimum output signal Vout.

Angle measurement accuracy is greater, the more sinusoidal are the output signals of the Wheatstone bridge used for detection of the magnetic field angle, i.e. the more a change in measurement voltage of the bridge tap behaves sinusoidally similarly to the angular rotation in the case of an assumed rotation of an external magnetic field to be detected. It is desired that identical nominal resistance magnitudes and behaviour of the bridge resistors R1 to R4 result in an output voltage Vout=A·Vb·cos($\theta$) with a scaling factor A dependent on the resistance behaviour of the measuring bridge, wherein $\theta$ is directed as the angle of the external magnetic field relative to the preferred direction, indicated by the arrows, of the magnetoresistive bridge resistors R2, R3 or with a 180° offset relative to the resistors R1, R4. However, a pure sine or cosine function is only seldom found in practice, as harmonics distort the sine and thus the ARCTAN-calculation may be erroneous, since it requires a pure sine.

Harmonics in the measurement voltage curve may be brought about by different effects, for example in that the rotating magnetic field is not uniform, for example due to induction, due to magnetic anisotropy of the resistance materials used, due to tolerances during assembly of sensor and magnet or inaccuracies or incorrect orientations of pole shoes or magnetic field conductive elements.

In the case of GMR and TMR sensors, a significant contribution to harmonics is made by the not exactly stable position of the magnetisation of the reference layer or of the pinning layer, which in practice is only a few nanometres thick. In practice, said layer has a tendency to rotate a little with the external field. The angle of rotation is the greater, the stronger is the external field. This results in harmonics in the output signal. In particular, the second, third, fourth and also the fifth harmonics are found in the output signal of the Wheatstone bridge, which leads to measurement inaccuracies.

There is therefore a need to improve harmonics in the angle measurement by means of magnetoresistive resistor arrangements.

BACKGROUND OF THE INVENTION

U.S. Pat. No. 6,633,462 B2 describes a concept for suppressing harmonics, in which a bridge resistor arrangement is formed of three sub-resistors, a central sub-resistor of greatest resistance, the preferred direction of which lies in the direction of the component to be measured, and two sub-resistors of lower resistance, the preferred direction of which deviates from the preferred direction of the component to be measured by an identical positive or negative angle respectively of 5° to 85°. In this way, any material anisotropy may be reduced and the sinusoidal curve of the measurement signal improved. Each bridge resistor arrangement has a preferred direction corresponding to the preferred direction of the central sub-resistor, diagonally arranged bridge resistors have identical preferred directions.

In further prior art known from EP 2 455 720 A1, as shown in FIG. 2, two sub-resistors RX1 and RX2 of a bridge resistor arrangement RX, i.e. R11 and R12 of the bridge resistor arrangement R1, are connected in series, their pinning directions and thus preferred directions being offset by an angle $\alpha$. In this way, the 180°/$\alpha$ harmonic is filtered. For instance, the third harmonic may be filtered at an offset angle $\alpha$=60°. Through a concatenation of a plurality of pinning directions, a plurality of harmonics may be filtered. The overall preferred direction of the measuring bridge is thereby modified towards an angle $\alpha$/2, as represented by the vector diagram in FIG. 2. As shown in the vector diagram of FIG. 2, in each bridge resistor arrangement R11-R12, R21-R22, R31-R32 and R41-R42 of the overall measuring bridge, which is composed in each case of a series circuit of two sub-resistors RX1-RX2 with different magnetic field-sensitive preferred directions, a preferred direction Rres of the bridge branch results, which corresponds to the direction of the bisector $\alpha$/2 of the deviation angle $\alpha$ of the two resistors RX1-RX2. Since all the bridge resistors have the same preferred direction in the positive or negative direction in the upper or lower half-bridge branch, the overall sensitivity direction of the overall bridge points in the direction Rres. Diagonal bridge resistors have identical orientations of the preferred directions of the sub-resistors and of the overall resistor.

It is feasible for each of these sub-resistors to be subdivided again and to split further into two elements, whose pinning directions differ by an angle $\beta$. As a rule, further splitting takes place symmetrically in a positive and negative angular amount about the preferred angular direction, such that the latter does not change any further. In this way, the 180°/$\beta$ harmonic may also be filtered. Splitting may be continued and thus theoretically any number of harmonics may be filtered, wherein the number of further sub-resistors in each case increases by a factor of two and thus a large number of sub-resistors and a precise orientation and identical resistance value are required.

As previously, the harmonic filtering is applied within each bridge branch. Because each individual bridge branch filters the same number of harmonics, the bridge voltage of these harmonics is also filtered. The number of necessary pinning directions in one bridge doubles with each filter. Thus, there are 2 pinning directions in the original configuration without filter (see FIG. 1). With a filter for one harmonic, there are then 4 pinning directions (see FIG. 2). Each bridge branch requires at least four sensor elements, i.e. sub-resistors. If two harmonics are filtered, a total of 8 pinning directions is obtained. Each bridge branch then contains at least eight sensor elements. In this case, the complete bridge requires at least 16 sensor elements. A sensor consisting of two bridges in this respect requires at least 32 sensor elements.

A further requirement of a high accuracy magnetoresistive angle sensor results from the fact that the overall resistance of the measuring bridge should on the one hand adopt a given value, in order to be optimally evaluated and to be able to influence a measurement current in a desired region, and from the fact that the resistance value of each individual bridge resistor arrangement in the magnetic field-free state and the sub-resistors constituting this should adopt nominally identical resistance values. With regard to manufacture, this can only be achieved in most cases with great difficulty or not at all, such that moreover the desired trigonometric curves of the measurement signals and optimal evaluation cannot be achieved. It is therefore desirable to be able to influence each resistor arrangement and the overall resistance of the measuring bridge during the manufacturing process or subsequently, in order in particular to counter tolerances in manufacture. Diagonal bridge resistors are of identical configuration and a plurality of different pinning directions is required in order effectively to reduce harmonics.

A disadvantage of the prior art is that filtering of harmonics by means of magnetoresistive resistor arrangements can only be achieved with high manufacturing complexity. Furthermore, homogeneity of the resistance behaviour in particular of TMR- or GMR-based resistor arrangements can be achieved only with difficulty, since the resistance values may be widely scattered during production.

The object of the present invention is to propose a resistor arrangement for a magnetoresistive angle sensor which achieves improved harmonic filtering and highly precise angular resolution with reduced manufacturing effort and circuit complexity.

This object is achieved by an angle sensor according to the independent claims. Advantageous embodiments of the invention constitute the subject matter of the subclaims.

SUMMARY OF THE INVENTION

The invention proposes a magnetoresistive Wheatstone bridge which comprises two bridge branches connected in parallel between a supply potential Vb, wherein two series-connected resistor arrangements R1 and R3 or R2 and R4 are arranged in each bridge branch with an interposed resultant differential voltage Vout. The resistor arrangements R1 and R4 or R2 and R3 of the two bridge branches are situated diagonally opposite one another and at least two magnetoresistive resistor arrangements R1, R2, R3, R4 have a magnetically sensitive preferred direction. The preferred directions of diagonally opposing magnetoresistive resistor arrangements of the bridge branches R1 and R4 or R2 and R3 differ from one another by an angle other than 0° or 180°.

This invention therefore describes a method for reducing the harmonics and achieving optimum resistance values. In contrast to the prior art, harmonics are not suppressed in the individual resistor arrangements, but rather are suppressed via functional interaction of different magnetic preferred directions of all the bridge resistor arrangements throughout the measuring bridge. In this way, the signal is improved and the resolution of the sensor is improved, wherein a smaller number of sub-resistors may be used. In the case of an angle sensor, angular accuracy may be increased thereby. The filtering of harmonics of a magnetoresistive resistance bridge is made possible by specifying the preferred directions Rres1 and Rres2 of the diagonally opposing resistor arrangements of the measuring bridge, wherein the overall sensitivity direction Rres results from vector addition of preferred sub-directions Rres1 and Rres 2 of diagonal resistor arrangements R2 and R3 or R1 and R4. The number and orientations of the magnetoresistive sub-resistors of each resistor arrangement in the two bridge branches are determined by the harmonic filtering, the overall preferred direction being the resultant thereof. No bridge resistor arrangement has a preferred direction which corresponds with the overall preferred orientation of the measuring bridge, and the resistor arrangements of the two half-bridges have different individual preferred directions and preferred directions.

The preferred directions of the bridge resistors of one half-bridge do not determine an identically oriented orientation of the preferred directions of the bridge resistors of the respective other half-bridge, in contrast to the prior art, which recites identity of the preferred directions of obliquely opposing bridge resistors R1-R4 and R2-R3.

In one advantageous further development, magnetic preferred directions of series-connected resistor arrangements R1 and R3 or R2 and R4 of each bridge branch may be oriented antiparallel. The magnetic preferred directions of two series-connected resistor arrangements R1-R3, R2-R4 of each bridge branch are oriented antiparallel, i.e. rotated by 180°. In this way, maximum sensor sensitivity is achieved, and the resistors of each bridge branch may also be arranged close together on a chip substrate and produced with an antiparallel preferred direction.

In an advantageous further development, the preferred directions of the resistor arrangements R1 and R2 or R3 and R4 situated opposite one another in pairs in the bridge branches may be oriented antiparallel. The preferred direction of the respective neighbouring pairs of resistor arrangements R1, R2 and R3, R4 situated in the two bridge branches may be oriented antiparallel. In this case, the preferred directions of the series resistor arrangements R1-R3 and R2-R4 are angled relative to one another, such that the respective diagonally situated resistor arrangements R1-R4 and R2-R3 also have mutually angled preferred directions.

If a measuring bridge is designed according to one of the above-stated embodiments, the overall preferred direction may be determined by superposition of the vectorial preferred directions of diagonal resistor arrangements. A preferred direction of one respective resistor arrangement of each bridge branch may in each case lie on a 0°-main axis, as defined for example in FIG. 1 in the measuring bridge 100, and the preferred direction of the respective other, series-connected resistor arrangement of each bridge branch may be angled, preferably by a 30°, 36°, 45° or 60°-angle. A 60°-angle serves in filtering the 3rd harmonic, a value of 45° in filtering the 4th harmonic, a value of 36° in filtering the 5th harmonic and 30° in filtering of 6th harmonic. This results in a resultant preferred direction of the measuring bridge which is angled relative to the original 0° main axis. This main axis may be regarded as a main axis of symmetry of the resistor arrangements on a chip substrate. According to the invention, the sensitivity direction differs from this main axis. For manufacturing reasons it may be desired to adjust the preferred direction in accordance with a geometric specification on the chip substrate, for example parallel to one substrate edge or along a structural element on the chip substrate, for example along a magnetic field direction of a compensating magnetic field which may be provided by an energised coil or conductor. For such an adjustment of a preferred direction, the spatial arrangement of the overall measuring bridge on the chip substrate may be selected accordingly. However, in order to achieve a desired preferred direction, the preferred directions of all the resistor arrangements may be rotated in the same direction even irrespectively of the spatial position of the resistor arrangements of the measuring bridge on the chip substrate. It may thus advantageously be possible to provide symmetrical angling of the preferred direction of all the resistor arrangements in positive and negative angular directions relative to the above-stated 0° main axis. Starting from an angle from which the overall preferred direction relative to 0° of a measuring bridge known from the prior art differs, the two angles of the preferred directions of respective diagonally opposing resistor arrangements R1 and R4 or R2 and R3 may be rotated about the positive preferred direction angle for R2 relative to 0° and the corresponding negative preferred direction angle for R3 relative to 0° and about this negative preferred direction angle for R1 and this positive preferred direction angle for R4 relative to 180°. Alternatively, the two angles of the preferred directions of respective diagonally opposing resistor arrangements R1 and R4 or R2 and R3 may be rotated from the 0° main axis about this positive preferred direction angle for R3 and negative preferred direction angle for R2 relative to 0° and this negative preferred direction angle for R1 and this positive preferred direction angle for R4 relative to 180°. If for example the preferred direction of the resistor arrangement R1 is oriented in a −180° and R3 in a 0° direction, and the preferred direction of R2 amounts to α and of R4 to 180°+α, as shown in FIG. 3a, the result is an angle of the overall preferred direction Rres along an axis in the α/2 direction. If the preferred directions R1 are rotated in the 180°−α/2 direction, R2 in the α/2 direction, R3 in the −α/2 direction and R4 in the 180°+α/2, the result is orientation of the overall preferred direction once again along the 0° axis. Thus, in the case of a spatial position of the resistor arrangements on a chip substrate, harmonic filtering and freely selectable adjustment of the direction of the preferred direction may be achieved. In particular, α=60 may be selected. In this case, irrespective of the spatial arrangement of the resistor arrangements on the chip substrate, the preferred direction of the measuring bridge may be set which thus arises along a midline of a mirror-symmetrical preferred direction distribution of the diagonal resistor arrangements.

In an advantageous further development, the resistance behaviour of each resistor arrangement R1, R2, R3 and R4 may be identical in respect of magnitude at least in the magnetic field-free state. It is advantageous for the resistance value of the sub-resistors R1X, R2X, R3X and R4X to be equal or identical and for the resistance value of the bridge resistors to be equal, such that exact setting of the overall preferred direction and accordingly precise calibration of the measuring bridge is possible.

In one advantageous further development, the magnetoresistive resistor arrangements may be AMR-, GMR-, or TMR-resistor arrangements, which are arranged on a chip substrate. The processing methods for producing such chip substrates may be achieved inexpensively with great accuracy, wherein measuring bridge arrangements resulting therefrom have a precisely definable preferred direction.

It may be sufficient for just two diagonally opposing resistor arrangements to comprise magnetoresistive resistors and for the other two resistor arrangements to represent ohmic resistors. In an advantageous further development, each resistor arrangement R1, R2, R3, R4 may comprise a magnetoresistive resistor with a preferred direction, wherein the preferred directions of diagonal opposing resistor arrangements of the bridge branches R1 and R4 or R2 and R3 differ by an angle α from one another, in particular by an angle α=60° in the case of TMR- or GMR-resistors or α=30° or α=36° in the case of AMR-resistors. Thus, optimisation of the measuring bridge is achieved and all the resistor arrangements may be produced using the same production method and different preferred directions.

In one advantageous further development, each resistor arrangement R1, R2, R3, R4 may comprise at least two magnetoresistive resistors RX1, RX2 with preferred directions offset relative to one another by an angle α2 or by further angles, wherein the resultant preferred directions of the two or more magnetoresistive resistors of diagonally opposing resistor arrangements of the bridge branches R1 and R4 or R2 and R3 differ from one another by an angle α1, wherein preferably α1=60° and α2=30° or α2=36°. In this way, filtering of a plurality of harmonic components may be achieved by the provision of two or more sub-resistors with different preferred directions, which may be directed according to the harmonic to be filtered, in a resistor arrangement RX of the measuring bridge. A value of 36° serves in particular in filtering a fifth harmonic.

In one advantageous further development, at least in a resistor arrangement R1, R2, R3 or R4 a trimming resistor RXT may be series-connected which is preferably selected so as to result in a resistance behaviour identical with regard to magnitude of the resistor arrangements R1, R2, R3 and R4. In this way, it is possible to achieve identical nominal values of the resistors and thus from the outset trimming of the measuring bridge and a defined setting of the overall preferred direction. An "on" trimming resistor in a trimming resistor arrangement on the one hand enables trimming of the resistance value of each resistor arrangement, such that the nominal resistance valve of each resistor arrangement is identical. On the other hand, the introduction of trimming resistors, during mass production of a plurality of wafers on the chip substrates of which measuring bridges are built, makes it possible to adapt the resistance behaviour of the measuring bridges of different wafers, such that manufacturing quality may be made homogeneous within each resistance bridge but also over a series of resistance bridges. In the case of TMR- or GMR-technology in particular, resistance values may be scattered as a result of minuscule process variations, such that manufacturing-related differences may be corrected using trimming resistors.

In one advantageous further development, the trimming resistor may be a magnetoresistive resistor which has a trimming resistor preferred direction; in particular the trimming resistor may be a TMR-resistor. When producing TMR-chip substrates, processing may result in wide scattering of the resistance behaviour, wherein the trimming resistors open up the possibility of achieving identical nominal behaviour of the resistor and thus trimming of the measuring bridge.

In one advantageous further development, a trimming resistor preferred direction may be oriented in the direction of a preferred direction of one resistor of the resistor arrangement, in the direction of the resultant preferred direction of the resistor arrangement in a bridge branch or in the direction of the overall preferred direction of the Wheatstone bridge. One trimming resistor RXT may be provided per bridge resistor arrangement RX, the preferred direction of said trimming resistor RXT being situated in the preferred direction of the bridge resistor RX of a bridge branch or the half-bridge RresX, or a trimming resistor RT, the preferred direction of which is situated in the overall preferred direction Rres. The overall resistance of the measuring bridge may thus be adjusted and manufacturing-related tolerances of the measuring bridge resistors, i.e. the four resistor arrangements, may be compensated.

In one advantageous further development, the trimming resistor may comprise a concatenation of at least two tunnel resistors between top electrodes and bottom electrodes, wherein the trimming resistor may be adjustable by electrode interruption of the top electrode or of the bottom electrode. Top electrodes may also be short-circuited with one another, so as to modify the resistance value. Series or parallel connections of trimming resistors may thereby be formed, to adapt the resistance value and optionally the preferred direction of a resistance bridge arrangement. In this way, a large number of trimming resistors may be provided using methods used in any event in the manufacturing method, so as to enable very fine trimming of the resistances.

In one advantageous further development, the trimming resistor may comprise a series and/or parallel connection of a plurality of trimming sub-resistors, in particular a plurality of tunnel resistors, wherein the number of parallel branches and/or series resistors of each parallel branch may be adjustable. Trimming resistors may be constructed as series and/or parallel connections of a plurality of identically oriented sub-resistors, wherein these may be short-circuited or separated into a parallel branch, in order to reduce the resistance value. Very fine adjustment may thus be achieved for precise trimming of a measuring bridge.

In one associated aspect, an angle sensor is proposed which comprises at least two of the above-stated magnetoresistive Wheatstone bridges offset by a predefined angle, in particular by 90°, for determining an angular orientation of a magnetic field by means of a first and a second sensor bridge, in particular a sine bridge and a cosine bridge. Three or more measuring bridges may also be included, which are in particular angled relative to one another in all three spatial directions, in order to produce a 3D-magnetic field sensor. The angle determines a mathematical relationship between the output signals of the measuring bridge, in order to determine the orientation of an external magnetic field. In the case of 90° angling, a simple ARCTAN-function of the two output values Vout may be used to determine a measuring angle.

In one advantageous further development of the angle sensor, sub-resistors R1X and R3X of the resistor arrangements R1, R3 of the first bridge branch R1-R3 may be arranged spatially adjacently on a chip substrate, and sub-resistors R2X, R4X of the resistor arrangements R2, R4 of the second bridge branch R2-R4 may be arranged spatially adjacently on the chip substrate. The first and second bridge branches R1-R3 and R2-R4 of each sensor bridge may be arranged diagonally relative to one another on the chip substrate. Thus, the resistor groups of the two bridge branches are situated diagonally relative to one another and adjacent to bridge branches of a measuring bridge advantageously rotated by 90°. Thus, the resistor arrangements of a sine and a cosine bridge may be arranged compactly and obliquely relative to one another in a 4-quadrant grid. This results in a space-saving, low-offset design for an angle sensor. Due to the close spatial proximity of the resistor arrangements of the measuring bridge, manufacturing-related scatter may be mutually compensated and high sensor accuracy achieved.

BRIEF DESCRIPTION OF THE DRAWINGS

Further advantages are revealed by the present description of the drawings. The drawings show exemplary embodiments of the invention. The drawings, description and claims contain numerous features in combination.

A person skilled in the art will expediently also consider the features individually and combine them into meaningful further combinations.

In the figures:

FIG. 1 shows a Wheatstone bridge of a prior art angle sensor;

FIG. 2 shows a Wheatstone bridge of a prior art angle sensor;

FIG. 3 shows a first embodiment of a Wheatstone bridge for an angle sensor according to the invention;

FIG. 4 shows a second embodiment of a Wheatstone bridge for an angle sensor according to the invention;

FIG. 5 shows an error diagram for angle sensors when using various measuring bridge configurations;

FIG. 6 shows a chip layout of an embodiment of an angle sensor according to the invention;

FIG. 7 is a sectional representation of trimming resistors for use in an angle sensor according to the invention;

FIG. 8 is a plan view onto trimming resistors for use in an angle sensor according to the invention;

FIG. 9 shows third and fourth embodiments of a Wheatstone bridge for an angle sensor according to the invention;

FIG. 10 shows fifth and sixth embodiments of a Wheatstone bridge for an angle sensor according to the invention;

FIG. 11 shows a seventh embodiment of a Wheatstone bridge for an angle sensor according to the invention;

Figure 5:
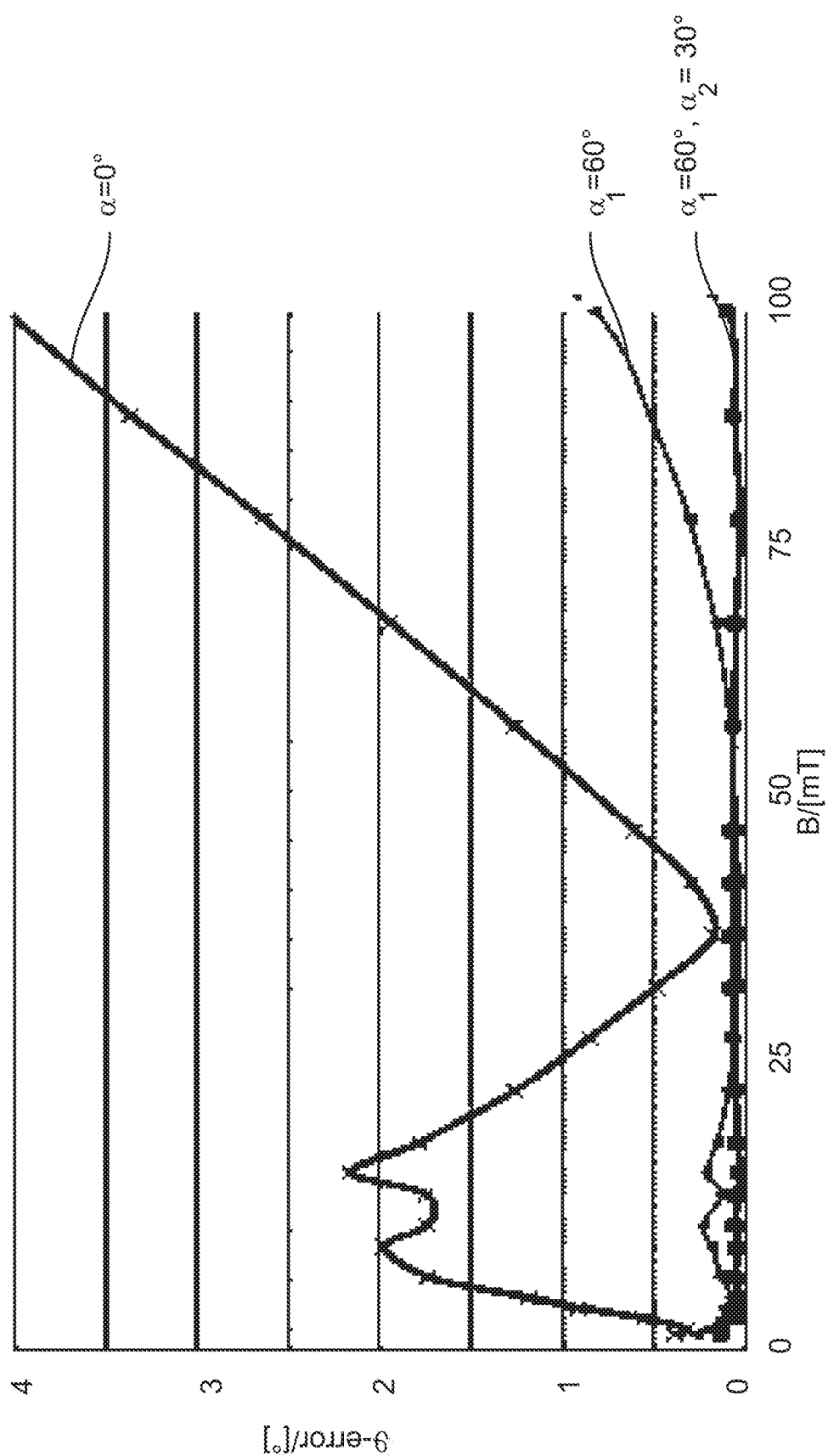

FIG. 12 shows an eighth embodiment of a Wheatstone bridge for an angle sensor according to the invention.

Identical elements are denoted with the same reference signs in the figures. The figures merely show examples and should not be understood as being limiting.

The concept according to the invention is described below with reference to the figures, said concept managing with fewer sensor elements than the designs known from the prior art while demonstrating comparable and indeed superior filter characteristics. A significant aspect is that filtering is not completely provided in each individual bridge branch or in individual bridge resistor arrangements, but rather is distributed over the four resistor arrangements.

Hereinafter, the magnetoresistive resistor elements are considered to be pinnable resistors which, as with GMR- or TMR-resistors, have a magnetic preferred direction in the pinning direction. In AMR-resistor types there is no pinning direction. The corresponding analogue to the pinning direction is here the strip direction which predetermines the direction of current flow. Thus, the further explanations may be applied mutatis mutandis. In the case of AMR, half the angle magnitudes should typically be assumed.

DETAILED DESCRIPTION OF THE PREFERRED EMBODIMENTS

FIGS. 1 and 2 show magnetoresistive measuring bridges 100, 102, which are known from the prior art and have already been discussed in the introduction. Diagonally arranged bridge resistors have identical magnetic preferred directions, which are symbolised by an arrow, and in the direction of which the highest sensitivity and greater change in resistance is achieved on variation of an external magnetic field. The preferred directions of the bridge resistors of a bridge branch are each rotated relative to one another by 180°. Thus, harmonic filtering and (linear) angle detection accuracy can only be achieved with major manufacturing effort and a large number of components and large chip size.

FIGS. 3 and 4 show two exemplary embodiments of magnetoresistive Wheatstone bridges for use in an angle sensor of the invention. FIG. 3*a* and FIG. 3*b* show simple resistance bridges 10.1 and 10.2 respectively, with an individual bridge resistor in each bridge resistor arrangement. The magnetoresistive resistor arrangements of bridge branches or a half-bridge, which are connected to the same outlet terminal connection Vout, each have an antiparallel pinning direction/preferred direction. In FIG. 3*a*, R1 and R3 are connected in one bridge branch to a terminal connection Vout and have an antiparallel pinning direction. R2 and R4 are likewise connected in one bridge branch to another terminal connection Vout and likewise have an antiparallel pinning direction. Diagonal bridge resistors R1 and R4 or R3 and R2 have preferred directions which are rotated by an angle α relative to one another. This arrangement brings about filtering of the bridge signals. In this case, the 180°/α harmonic is suppressed. In each bridge branch, the respective resistor arrangements have an angular offset of 180°, wherein mutually opposing resistor arrangements of each bridge branch have an angular offset of 180°−α. The advantage is obvious. To achieve a similar filter effect, this harmonic filtering requires only half the number of sensor elements.

In FIG. 3a, the series-connected resistor arrangements R1 and R3 of one half-bridge and R2 and R4 of the corresponding second half-bridge each have antiparallel preferred directions. The preferred directions of the resistor arrangements R1 and R2 and R3 and R4 are each rotated by the angle α relative to one another.

In contrast, FIG. 3b shows a measuring bridge 10.2 in which, in the series circuit of the resistor arrangements R1 and R3 of one half-bridge and R2 and R4 of the corresponding second half-bridge, the preferred directions of the resistor arrangements are each rotated by the angle α relative to one another. The preferred directions of the resistor arrangements R1 and R2 and R3 and R4 opposite one another in pairs are each oriented antiparallel relative to one another. With regard to circuitry, the measuring bridge 10.1 shown in FIG. 3a may be converted into the measuring bridge 10.2 shown in FIG. 3b by swapping the supply voltage and output voltage contacts Vb and Vout.

FIG. 3a and FIG. 3b show, by way of vector graphs, how the preferred directions or sensitivity directions Rres of the overall bridge 10.1 or 10.2 respectively may be determined. Vectorial superposition of the preferred directions of R3 and R2, the diagonally opposing resistor arrangements, produces a resultant vector Rres which is directed parallel to the sensitive axis, i.e. in the preferred direction of the resistance bridges. The resistance bridge has the highest sensitivity along this bridge, wherein harmonics are suppressed.

Each resistor arrangement of a half-bridge R1, R3 and R2, R4 has a preferred direction, i.e. an axis of sensitivity, wherein the overall preferred direction Rres of the half-bridge does not correspond, as it does in the prior art, to the preferred direction of each individual resistor arrangement, but rather arises in a direction α/2 of the orientation of the preferred directions of diagonal resistor arrangements which differ from one another by α. If the half-bridges are interconnected as in FIG. 3a, such that in the half-bridge the preferred directions are each identically oriented but have antiparallel preferred directions, an overall preferred direction Rres of the overall bridge is achieved through vectorial superposition of the preferred directions of the diagonal resistor arrangements R3 and R2. The same filtering is also achieved, as shown in FIG. 3b, by resistor arrangements R1, R2 or R3, R4 arranged adjacent in pairs of the two bridge branches having antiparallel preferred directions, and the preferred directions within one bridge branch differing by the angle α. This therefore results in the sensitivity direction Rres of the overall bridge 10.1 and 10.2 in the cases of FIGS. 3a and 3b through vectorial superposition of the preferred directions of the diagonally opposing resistor arrangements R3 and R2. In contrast to the prior art, harmonic filtering takes place through interplay of the resistors of the two half-bridges, and not—as is known in the prior art—within just one bridge resistor.

The arrangements according to the invention in FIGS. 3a and 3b filter the n-te harmonic, wherein n=180/α.

FIGS. 4a and 4b show exemplary embodiments of a measuring bridge 12.1 or 12.2 respectively, with which a further harmonic may be filtered. This is achieved by each resistor arrangement R1 to R4 being subdivided into two sub-resistors R11, R12, ..., R41, R42, wherein the pinning directions of the two sub-resistors RX1 and RX2 are at an angle α2 to one another. The preferred directions of diagonal resistor arrangements are rotated by the angle α1 relative to one another. This arrangement results in filtration of the harmonic 180°/α1 and the harmonic 180°/α2. In FIG. 4a, in measuring bridge 12.1 the preferred directions of the respective upper and lower bridge resistor of each half-bridge, R1-R3 or R2-R4, are oriented antiparallel by 180° and the preferred directions of diagonal resistor arrangements are rotated by an angle α1. In FIG. 4b, in measuring bridge 12.2, the preferred directions of the resistor arrangements of each bridge branch are rotated by α1 relative to one another, wherein resistor arrangements opposite one another in pairs of the two bridge branches are oriented antiparallel. The circuit configuration of measuring bridge 12.2 of FIG. 4b may be produced by swapping Vb and Vout from measuring bridge 11.1 of FIG. 4a. The advantage of this arrangement is again obvious. Two harmonics may be filtered, as provided by the design of FIG. 2 already known from the prior art, but in contrast only 8 sensor elements are needed instead of 16, wherein in the prior art all preferred directions and the filtering action must be present within each bridge resistor. The arrangement may be made smaller and simpler, so reducing costs. Each resistor arrangement comprises only some of the possible preferred directions.

The vector diagrams of FIGS. 4a, 4b are graphical representations of how the sensitive axis (overall preferred direction) Rres of the overall bridge 12.1 or 12.2 respectively is obtained. Since the two bridge resistors in each half-bridge are of identical construction and display the same behaviour with regard to magnitude, but with the angles of the preferred directions rotated in each case by 180° and the two half-bridges have different preferred directions, the overall preferred direction Rres is obtained by superposition of the preferred directions of the two half-bridges Rres1 and Rres2 as interplay of the two half-bridges for the overall bridge.

The resultant preferred direction angle α1/2+α2/2 is obtained very simply by means of vector algebra, as the appended vector diagram of the preferred directions of the individual magnetoresistive resistors shows, and can be expressed mathematically by:

$$\frac{\alpha 1 + \alpha 2}{2} = \arctan\left(\frac{\sin(\alpha 1) + \sin(\alpha 2) + \sin(\alpha 1 + \alpha 2)}{1 + \cos(\alpha 1) + \cos(\alpha 2) + \cos(\alpha 1 + \alpha 2)}\right)$$

FIG. 5 shows simulated angular errors of a TMR angle sensor consisting of two measuring bridges for different flux densities, assuming an exciter signal affected by harmonics. θ-err is the angular error, i.e. the deviation of the error determined by the angle sensor from the actual angle θ. In this case, the angular error θ-err was calculated with the assumption that the phase of cosine and sine is exactly 90°, the amplitudes of the two bridges are exactly identical and the offset of the two bridge signals is identical at zero. In the case α=0°, the error of a measuring bridge used in the prior art according to FIG. 1 is shown. α=60° corresponds to the measuring bridge arrangement of FIG. 3 and α1=60° and α2=30° to the measuring bridge arrangement of FIG. 4. The resultant error is caused by the harmonics in the measurement set-up and in the movement of the direction of magnetisation of the reference layer. It is obvious that the filter concepts according to the invention function extremely well.

Figure 6A:
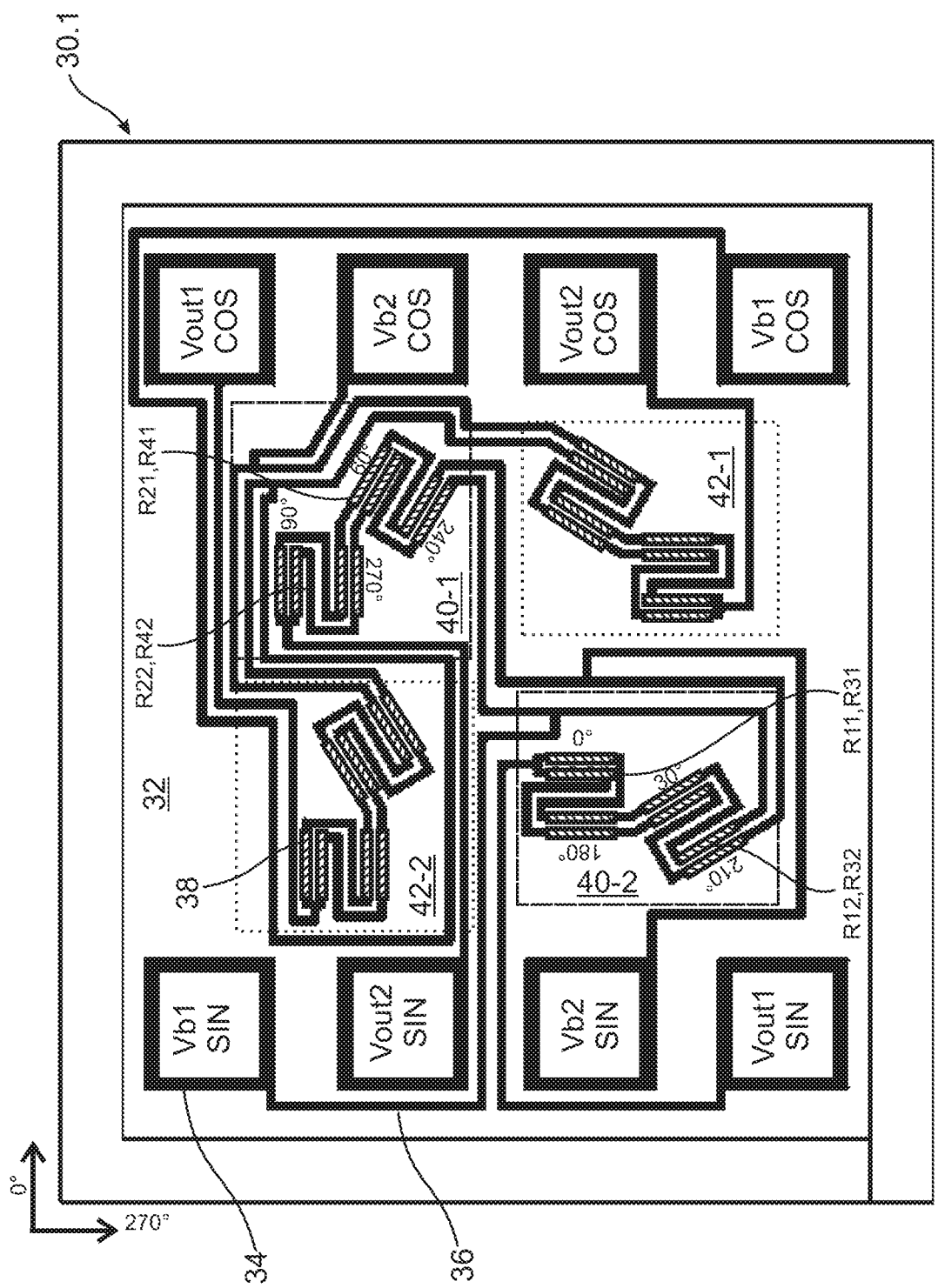
Figure 6B:
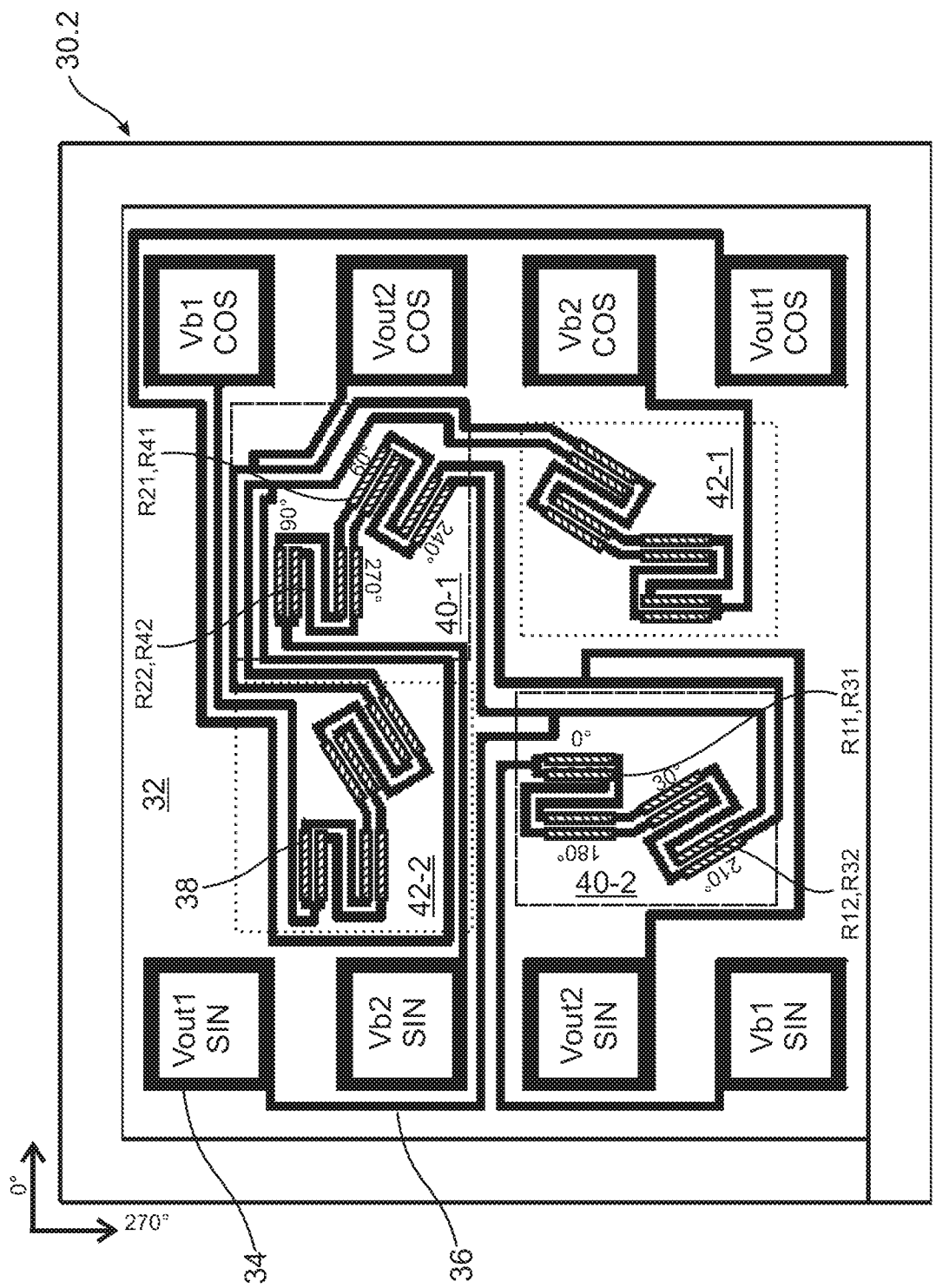

FIGS. 6a and 6b show chip layouts of an angle sensor 30.1 or 30.2 respectively, which are each of identical construction but may, as already explained with regard to FIGS. 3a, 3b and 4a, 4b, be converted into one another by swapping supply and measuring taps Vb, Vout. The angle sensors 30.1, 30.2 consist of two resistance bridges 40, 42 rotated relative to one another by 90°, which are constructed according to the measuring bridges 12.1, 12.2 shown in FIGS. 4a and 4b. The angles are selected with α1=60° and α2=β=30°. The two Wheatstone bridges 40, 42 serve to determine a sine and a cosine component of a magnetic field and are arranged on a chip substrate 32. In this case, the respective antiparallel resistor arrangements of a bridge branch R1, R3 40-1 and R2, R4 40-2 and R1, R3 42-1 and R2, R4 42-2 of each resistance bridge 40, 42 are arranged spatially adjacent one another and the two branches of each bridge 40, 42 are arranged diagonally relative to a centre point of the chip layout on the substrate 32. The bridge branches of the two bridges 40, 42 are thereby arranged spatially adjacent one another on the chip substrate 32. Provided on the left on the chip substrate 32 are pad connections 34 of the sine bridge 40, two pads for the voltage supply UBSIN and GNDSIN and two pads for the differential bridge tap SIN+ and SIN−. Similarly, on the right, the pads UBCOS and GNDCOS are provided for the voltage supply and the pads COS+ and COS− for the centre tap of the cosine bridge 42. Thus, Vb1 SIN and Vb2 SIN represent the supply voltage connections Vb, and Vout1 SIN, Vout2 SIN represent the two contacts of the output terminal Vout, the same applying mutatis mutandis for the cosine bridge 42. TMR elements are located in the middle of the angle sensor chip 30. The TMR elements of the upper and lower bridge resistors 40-1 or 40-2 respectively are grouped in dashed rectangles and belong to the sine-bridge 40, the lower and upper bridge resistors 42-1, 42-2 in the dotted rectangles belonging to the cosine bridge 42. The elements are thus assembled in squares. For the sine bridge 40, the existing pinning angles are indicated in each square with regard to the 2D coordinate system represented top left and the associated resistors are connected according to the bridge 12 of FIG. 4. The angle sensor 30.2 of FIG. 6b may be achieved by swapping the connections of Vb and Vout of the angle sensor 30.1, wherein the circuit configuration thereof of the individual measuring bridges varies in accordance with the depictions in FIG. 4b relative to FIG. 4a.

The essential point of the exemplary embodiments of magnetoresistive bridge configurations for use in an angle sensor is that identical but antiparallel preferred directions of the two bridge resistors are present within one half-bridge, but the two half-bridges have differently oriented reference directions, wherein these together result in the overall preferred direction of the measuring bridge. In this way, harmonics may be effectively suppressed with a reduced number of bridge resistors and a virtually perfect sine-/cosine-shaped output voltage curve may be achieved, since not every preferred direction of a harmonic has to be modelled in every resistor arrangement or every half-bridge.

The above proposals are based on the fact that the resistance value of each bridge resistor, which may in turn be composed of a plurality of sub-resistors in series connection, is ideally of identical magnitude. With regard to manufacture, this can only be achieved with difficulty, since the resistance values of the bridge resistors scatter. Likewise with regard to manufacture, first of all a change in resistance, for example of a wafer, which is the same for all resistors may arise, which leads to a modified overall resistance of the measuring bridge, which is disadvantageous for integration into evaluation electronics. It is therefore possible, through the trimming resistors, to achieve both identical resistor arrangements within a measuring bridge and identical measuring bridge behaviour over a plurality of wafers.

Therefore, effective harmonic filtering and high accuracy of angular resolution may be achieved with the exemplary embodiments depicted in FIG. 4a, FIG. 4b and FIG. 6a, FIG. 6b. However, a prerequisite is identical behaviour with regard to magnitude of the resistance values in respect of a specified magnetisation in the preferred direction. Only in this way can the bridge circuit be used for efficient harmonic filtering. In addition to the arrangement with different pinning directions, it is therefore desirable and advantageous for trimming resistors RT 50 to be provided, which make it possible to minimise non-identical resistance distribution on a wafer or to make the resistances uniform and achieve identical nominal values, or to trim the average resistance value on a wafer. Trimming resistors 50 may be connected in series or in parallel to a sub-resistor or a resistor arrangement, in order to adapt the overall resistance value and optionally also the preferred direction.

Above all, in the case of TMR sensors a strongly scattering resistance distribution regularly arises on a chip substrate, since the slightest changes in barrier thickness exhibit major changes in barrier resistance. Only with trimming resistors 50 is it advantageously possible to build a sensor which may firstly be tightly specified with regard to the resistance value (for example average ±20%) and secondly has a good angular accuracy.

If possible, trimming resistors 50 should have the same characteristics as the actual magnetoresistive elements on the chip. In other words, the trimming resistors 50 should also be AMR-, GMR- or TMR-elements, which may as required be connected or suppressed.

One possible way of configuring trimming resistors 50 is shown in FIGS. 7 and 8. In FIG. 7, 10 identical tunnel resistors 54 are present in the form of 10 tunnel elements. In this case, the current is fed in via a top-electrode 52 and flows through the tunnel element 54 into a bottom electrode 56 and then through a second tunnel element 54 back again into the top electrode 52. Bottom electrode 56 and top electrode 52 are separated by an insulation layer.

FIG. 7a shows that the four left tunnel elements 54 do not contribute to the overall resistance RT, since the top electrode 52 short-circuits the four tunnel elements 54. It should be noted in this respect that the top electrode 52 typically has a resistance which is lower by a factor 100 than that of the tunnel elements 54.

If it is noted that the average resistance value of the tunnel elements is somewhat too low, for example using a monitoring tool (CIPT or Current in Plane Tunnelling method—current field distribution measurement), the external tunnel elements 54 may be connected by modifying the top electrode 52 in such a way that these two tunnel elements 54 become active. If it is then noted that the resistance of the trimming resistor RT is somewhat too high, for example by a monitoring CIPT method, further tunnel elements 54 may be short-circuited.

The different shape of the top electrode 52 may be obtained by different photolithographic masks. Different masks may be selected which model the different shape of the top electrode layer 54. A pre-measurement which identifies which resistance value is present on the current wafer is advantageous. According to this pre-measurement, it is possible to select the suitable compensating mask, so that the measuring bridge 10, 12, 14, 16, 18 or 20 ultimately reaches the specified resistance value.

Figure 8A:
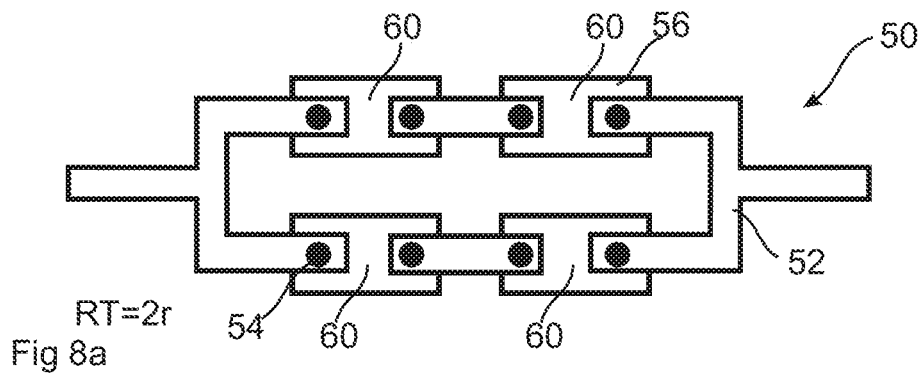

An even more precise arrangement of the trimming resistors 50 is obtained from a parallel connection of tunnel resistors 54, as clarified in FIG. 8. Two rows of in each case four tunnel resistors 54 are provided on the chip substrate, which tunnel resistors may be adjusted into very precisely adjustable trimming resistance values R by electrode interruptions 60 or an electrode short-circuit. The following trimming resistors 50 are obtained, from the top downwards:

FIG. 8a depicts a parallel connection of in each case four series-connected tunnel resistors 54. The resistance value RT of the trimming resistor is RT=2r, wherein r corresponds to the resistance value of a tunnel resistor 54.

Figure 8B:
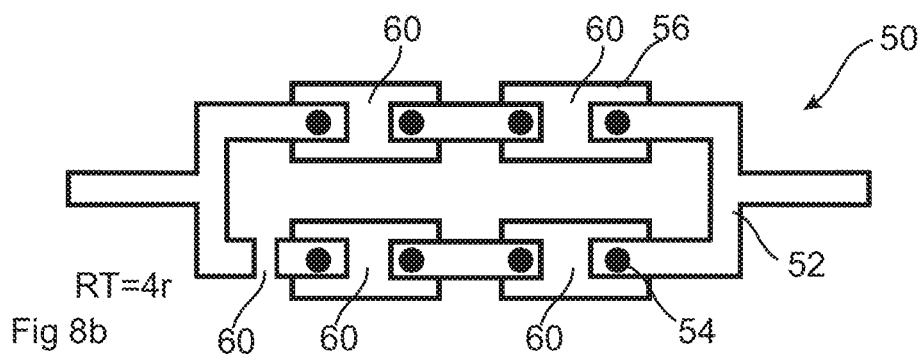

FIG. 8b depicts a series connection of four tunnel resistors 54, since the lower branch is disconnected by an electrode interruption 60. The trimming resistance value is RT=4r.

Figure 8C:
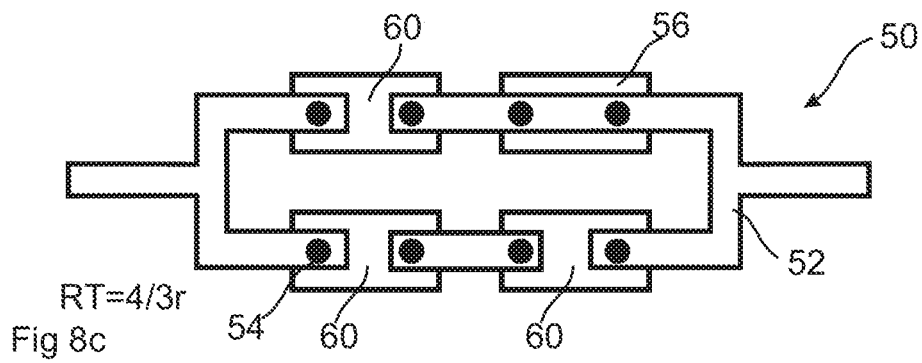

FIG. 8c depicts a trimming resistor 50 of the magnitude RT=4/3r, since in the upper branch two tunnel resistors 54 and in the lower branch four tunnel resistors 54 are series-connected.

Figure 8D:
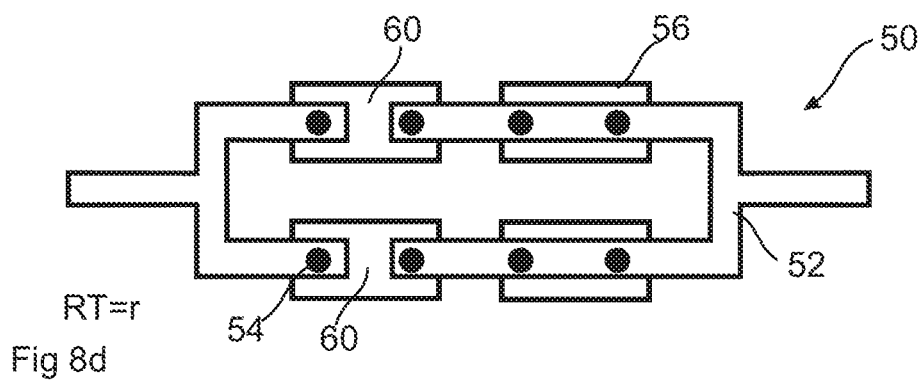

FIG. 8d shows a trimming resistor 50 of the magnitude RT=r; in the upper and lower parallel branch in each case two tunnel resistors 54 are series-connected.

If resistors are used in pairs in each half-bridge or in each bridge resistor for the purpose of harmonic filtering, as the prior art proposes and as the trigonometric formulae trivially stipulate, the trimming method has the major disadvantage that the changes in the top electrode have also to take place in pairs. The two resistors R11 and R12 have to be modified identically, otherwise the harmonic filtering is configured distortedly rather than correctly. This means that at least four tunnel elements 54 have to be added or short-circuited. If a bridge branch consists of four different resistors with four different pinning directions (R11, R12, R13, R14), as in FIG. 4, 6 or 9, at least 8 tunnel elements 54 have to be connected or short-circuited for this purpose. If there are, for example, 16 or 32 or 64 elements 54 in series/bridge quadrant, then an accuracy of ±50%, ±25% or ±12.5% respectively is achieved by the trimming resistors 50. These accuracies are all unsatisfactory. Better trimming technology is needed.

The technology which allows both trimmable resistors and good filtering is composed advantageously of two (RX, RXT), three (RX1, RX2, RXT) or five (RX1, RX2, RX3, RX4, RXT) or more sub-resistors per bridge resistor arrangement R1, R2, R3 and R4.

FIG. 3 shows a measuring bridge 10 in which an individual magnetoresistive (sub-)resistor R1, R2, R3, R4 is provided in each bridge resistor arrangement, with preferred directions shown by arrows. The preferred directions of the series-connected resistor arrangements of each bridge branch point in antiparallel directions, wherein the two half-bridges have preferred directions angled relative to one another.

FIGS. 9a and 9b likewise show two alternative, trimmed exemplary embodiments 14 and 16, wherein in each bridge branch one trimming resistor RXT is additionally provided per bridge resistor arrangement RX (X denotes the position of the bridge resistor arrangement 1, 2, 3 or 4), which trimming resistor leaves the preferred direction unchanged either per branch or for the overall arrangement, and the individual resistance of the bridge resistor arrangement and the overall resistance of the half-bridge and the overall bridge may be adjusted:

As is shown in the respective associated vector diagrams, each trimming resistor RXT may be pinned in the same preferred direction, as shown in FIG. 9a in the bridge 14, like the preferred direction of the fundamental bridge resistor R1, R2, R3, R4, such that the preferred direction of the bridge resistor is not modified per se. To this end, trimming resistors R1T (0°), R2T ($\alpha$), R3T (0°) and R4T (180°−$\alpha$) are provided, which are oriented in the same direction as the other preferred direction of the bridge resistor.

Alternatively, as shown in the bridge 16 in FIG. 9b, each trimming resistor may also be oriented in the direction of the desired preferred direction of the overall bridge, such that identically oriented trimming resistors RT+($\alpha$/2) or trimming resistors RT−(180°−$\alpha$/2) may be used with preferred directions rotated by 180°.

Figure 10A:
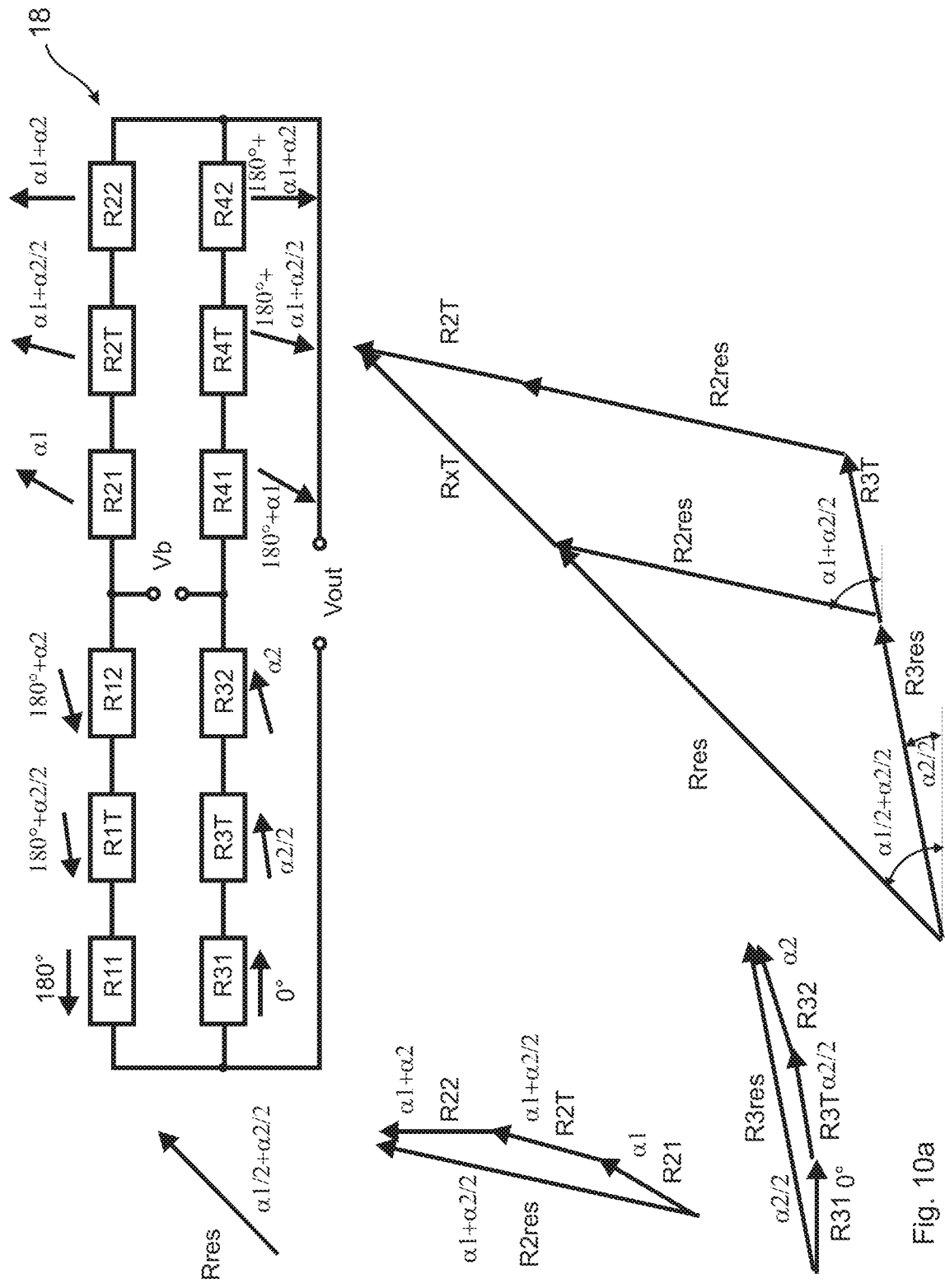
Figure 10B:
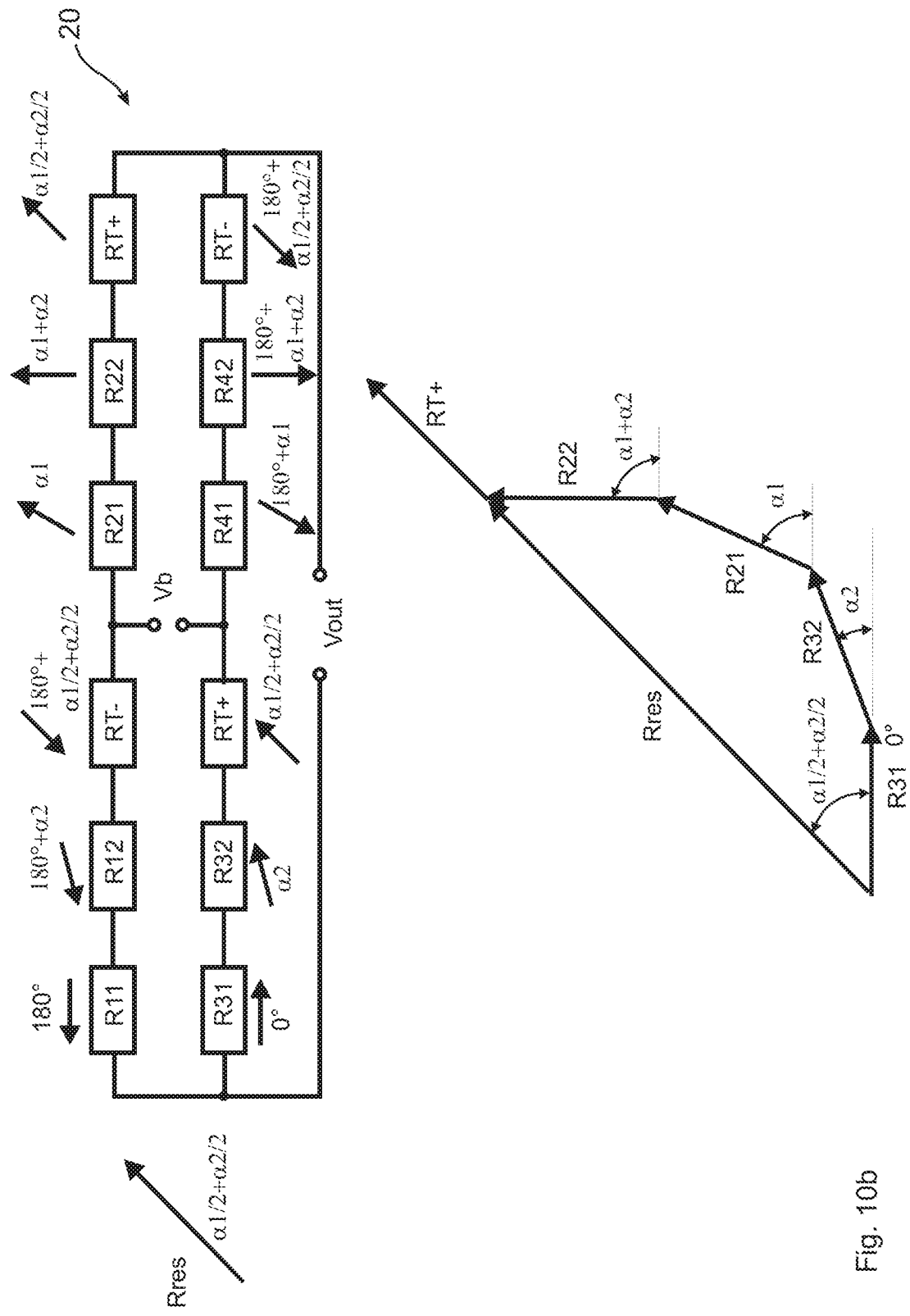

With regard to manufacture, and for the purpose of simplified adjustment, the upper circuit variant is preferable, i.e. the trimming resistors preferably have a preferred direction which corresponds to the overall preferred direction of the individual bridge resistor (depicted on the left in the following vector diagram):

If, as shown in FIG. 4, a plurality of harmonics are to be filtered, exemplary embodiments of circuit variants depicted in FIGS. 10a and 10b are obtained.

Here, the resistors RX1 and RX2 of each bridge resistor X=1, 2, 3, 4 are arranged as in FIG. 4. As a result of the angle $\alpha$2, the 180°/$\alpha$2 harmonic is filtered. These two resistors each for example comprise 8, 16 or 32 tunnel elements in series.

In the configuration of a bridge 18 shown in FIG. 10a, the trimming resistor RXT connected in between RX1 and RX2 is oriented precisely in the bisector between RX1 and RX2. This is particularly favourable with regard to production since subsequent resistors of the series connection require a change in preferred direction which does not differ very greatly from the preferred direction of the preceding or subsequent preferred direction, so simplifying pinning adjustment.

Alternatively, all the trimming resistors RT+/− may also, as shown in the configuration of the bridge 20 according to FIG. 10b, be arranged in the overall preferred direction Rres ($\alpha$1/2+$\alpha$2/2) or rotated by 180° thereto. In FIGS. 10a and 10b, corresponding vector diagrams of the respective upper circuit configuration of exemplary embodiments show the configuration of the preferred direction Rres.

As has already been noted further above, the vector diagram of the bridge 18, in which each trimming resistor RXT has a preferred direction in the overall preferred direction RresX of the bridge resistor RX, composed of RX1 & RX2, in FIG. 10a is preferable, since with large resistance tolerances it is both more simply possible, both with regard to manufacturing and theoretically, to adjust the individual resistors. The preferred direction RresX applies to the entire half-bridge, since both bridge resistors are oriented antiparallel, and reinforce the preferred direction sensitivity. The circuit configuration according to FIG. 10b, in which each trimming resistor RXT has a preferred direction in the preferred direction of the overall bridge 20, it is preferable for the overall magnitude of the bridge resistor to be modified, or if only slight resistance tolerances are to be compensated.

A trimming resistor preferably consists of for example four tunnel elements. As a result of the respective top electrode mask, it is possible to trim with a resolution of just 2 tunnel elements. This makes it possible, in the case of 16, or 32 or 64 elements in series per bridge quadrant (bridge resistor), to adjust the resistance value with an accuracy of 12.5%, 6.25% or 3.125% respectively of the bridge resistor arrangement, without the harmonic filtering being impaired. The same trimming resolution is also possible if four sub-resistors R11, R12, R14, and R15 are provided, which are split by the angle $\alpha$1 and by the angle $\alpha$2. Once again, the trimming resistor R13 is situated in the bisector of $\alpha$1 and $\alpha$2.

FIG. 11a and FIG. 11b show further embodiments 22.1 and 22.2 respectively of measuring bridges. In the measuring bridge 22.1 and 22.2, the preferred directions of all the resistor arrangements are rotated by the angle −$\alpha$/2 relative to those of the resistor arrangements of the measuring bridges 10.1 and 10.2 of FIG. 3; otherwise measuring bridge 22.1 corresponds to measuring bridge 10.1 and measuring bridge 22.2 to measuring bridge 10.2. Thus, the preferred directions of all the resistor arrangements are rotated by the same angular amount, in order to achieve a desired orientation of the angle of the overall preferred direction Rres of the measuring bridge. In this way, a preferred direction may be oriented independently of a given spatial positioning of the resistor arrangements on a chip substrate. Assuming a main axis with 0°, which corresponds to an orientation of the preferred direction of the measuring bridge 100 of the prior art according to FIG. 1, in FIG. 11a. the preferred direction of the resistor arrangements R1 and R3 of the measuring bridge 22.1 is angled by the angle $-\alpha/2$ to the 0° or 180° axis. Furthermore, the two angles of the preferred directions each of respective diagonally opposing resistor arrangements R1 and R4 or R2 and R3 differ from the 0° main axis by a positive angle $\alpha/2$ for R2 relative to 0° and negative angle $-\alpha/2$ for R3 relative to 0° and by a negative angle $\alpha/2$ for R1 and positive angle $\alpha/2$ for R4 relative to 180°, such that diagonal resistor arrangements are rotated by the angle $\alpha$ relative to one another. This gives rise to the further possibility of suppressing harmonics.

Preferably, $\alpha=60°$ may be selected. In the vector diagram below it is apparent that the overall preferred direction Rres of the measuring bridge 22.1 points in the direction of the 0° main axis, such that the preferred axis is already clearly visible in the chip layout.

FIG. 11b shows a measuring bridge 22.2 which results from the measuring bridge 22.1 by swapping measuring tap Vout and supply contacts Vb. In this case, the two angles of the preferred directions of respective diagonally opposing resistor arrangements R1 and R4 or R2 and R3 differ from the 0° axis, 180° or 0°, by the positive angle $\alpha/2$ for R3 and the negative angle $-\alpha/2$ for R2 relative to 0° and a negative angle $-\alpha/2$ for R1 and a positive angle $\alpha/2$ for R4 relative to 180°. In this case too, the axis of the preferred direction/sensitivity direction is oriented in the 0° main axis for equal resistance magnitudes of the resistor arrangements.

Figure 12A:
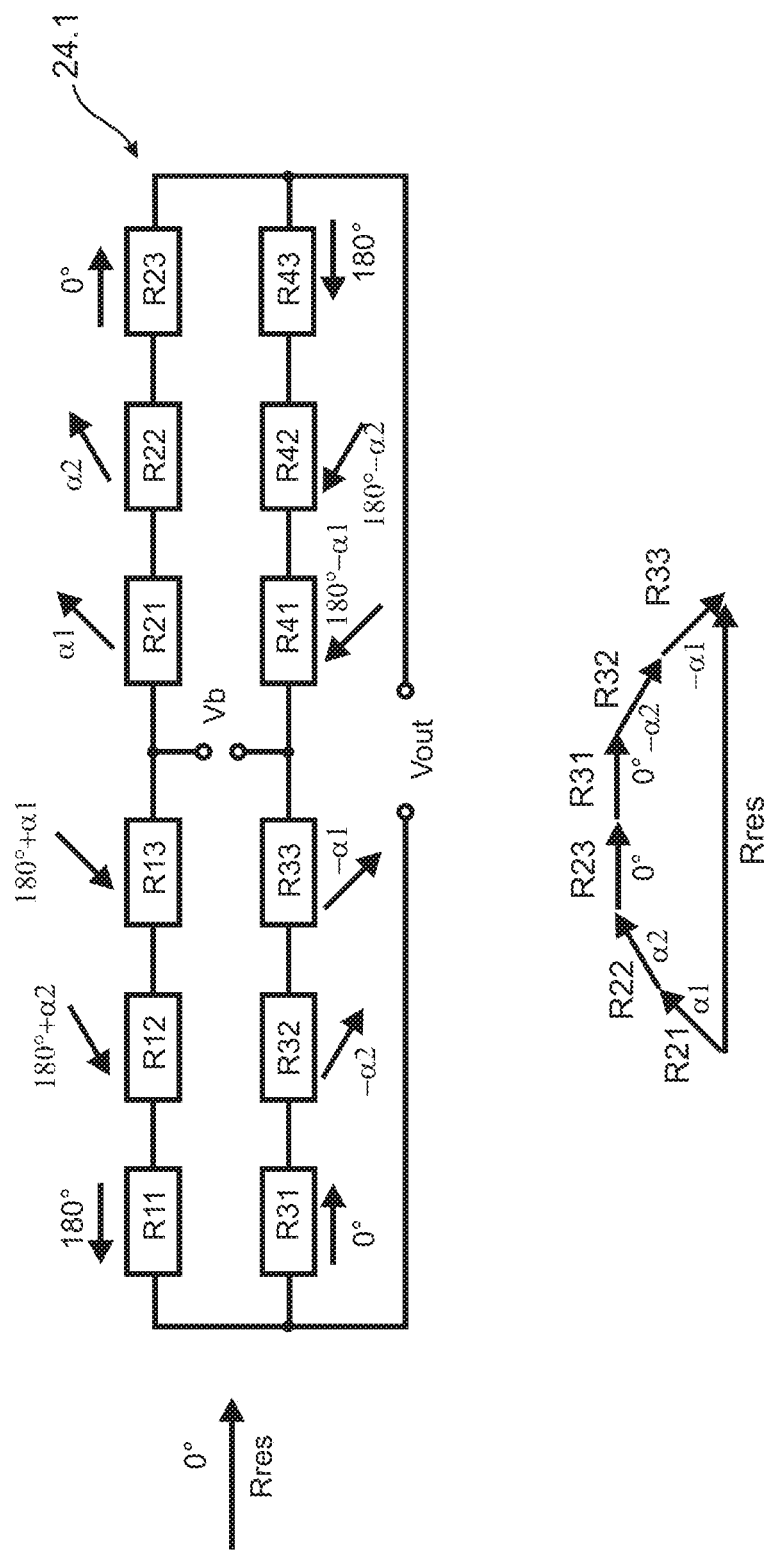
Figure 12B:
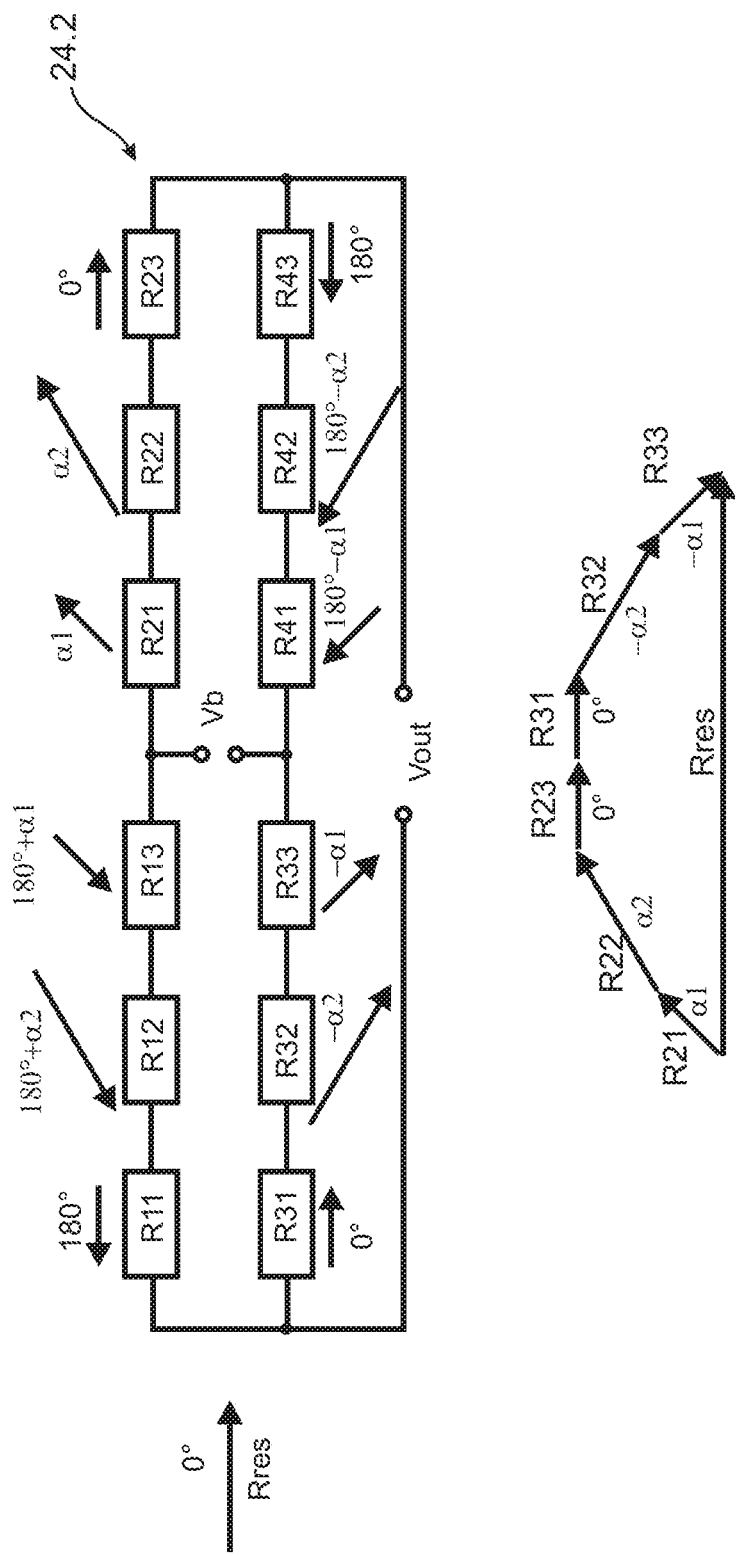

FIGS. 12a and 12b depict further exemplary embodiments of a measuring bridge 24.1 and 24.2 respectively. Each resistor arrangement comprises three sub-resistors RX1, RX2 and RX3, wherein the middle sub-resistor RX2 may preferably take the form of a trimming resistor; the other resistors may however also be trimming resistors. Each resistor arrangement R1, R2, R3 and R4 thus comprises three series-connected resistors, wherein the preferred directions of the sub-resistors RX2 and RX3 differ from the preferred direction RX1 by the angles $\alpha2$ and $\alpha1$. The preferred directions of the sub-resistors of diagonally opposing resistor arrangements differ in that the signs of the angle deviations $\alpha2$ and $\alpha1$ are reversed. The angles $\alpha1$, $\alpha2$ for R2X and R1X differ in the positive direction, while those for R3X and R4X differ in the negative direction.

If the resultant preferred directions of the resistor arrangements R1, R2, R3 and R4 of the measuring bridge 24.1 are considered, a preferred direction configuration arises which is comparable with the measuring bridge 22.2 of FIG. 11b but, instead of just one harmonic, two harmonics may be filtered out. Resistor arrangements opposing one another in pairs have antiparallel preferred directions, while diagonally opposing resistor arrangements have preferred directions which differ from one another by a fixed angle. If $\alpha2=\alpha1/2$ is selected, $\alpha2$ of the measuring bridge 24.1 corresponds to the angle $\alpha/2$ of the measuring bridge 22.2. Advantageously $\alpha2=30°$ and $\alpha1=60°$ are selected.

The embodiment 24.2 of FIG. 12b corresponds to the embodiment of FIG. 12a, except that the resistance value of the middle sub-resistor RX2 is selected to be twice that of the sub-resistors RX1, RX3. If the preferred direction RX2 is situated in the preferred direction of the respective resistor arrangement RX, i.e. $\alpha2=\alpha1/2$ applies, an increase in the resistance value of RX2 stabilises the orientation of the preferred direction of the resistor arrangement. In the vector diagram below, it is clear that the vector lengths of the sub-resistors R22 and R32 are twice as long as the vector lengths of the other sub-resistors, and thus the vector orientation Rres and the overall resistance behaviour dominate. A change in resistance at the sub-resistors R22, R32 thus does not in any way change the orientation of the preferred direction, but it does influence the overall resistance behaviour of the measuring bridge In the invention, each resistor arrangement may comprise more than two or three sub-resistors with different preferred directions, such that a larger number of harmonics may be filtered. Effective harmonic filtering is achieved by the interplay of the preferred directions of all the resistor arrangements relative to one another. Harmonics may be effectively filtered with preferred directions of the sub-resistors at 60°–3rd harmonic number, 45°–4th harmonic number, 36°–5th harmonic number, 30°–6th harmonic number, i.e. at [180/(harmonic number)].

LIST OF REFERENCE NUMERALS

10 First embodiment of a Wheatstone bridge
12 Second embodiment of a Wheatstone bridge
14 Third embodiment of a Wheatstone bridge
16 Fourth embodiment of a Wheatstone bridge
18 Fifth embodiment of a Wheatstone bridge
20 Sixth embodiment of a Wheatstone bridge
22 Seventh embodiment of a Wheatstone bridge
24 Eighth embodiment of a Wheatstone bridge
30 Angle sensor
32 Chip substrate
34 Contact pad
36 Conductor track
38 Magnetoresistive bridge resistor
40 Sine bridge
42 Cosine bridge
50 Trimming resistor
52 Top electrode
54 Tunnel resistor/tunnel element
56 Bottom electrode
58 Insulation layer
60 Electrode interruption
100 Prior art Wheatstone bridge
102 Prior art Wheatstone bridge

The invention claimed is:

1. Magnetoresistive Wheatstone bridge comprising two bridge branches connected in parallel between a supply potential Vb, two series-connected resistor arrangements R1 and R3 or R2 and R4 arranged in each bridge branch with an interposed measuring potential Vout, and the resistor arrangements R1 and R4 or R2 and R3 of the two bridge branches being diagonally opposite and at least two magnetoresistive resistor arrangements R1, R2, R3, R4 having a magnetically sensitive preferred direction, the preferred directions of diagonally opposing magnetoresistive resistor arrangements of the bridge branches R1 and R4 or R2 and R3 differing from one another by an angle other than 0° or 180, wherein the preferred directions of the series-connected resistor arrangements R1 and R3 or R2 and R4 of each bridge branch are oriented antiparallel, or the preferred directions of the resistor arrangements R1 and R2 or R3 and R4 situated opposite one another in pairs in the bridge branches are oriented nonparallel.

2. Wheatstone bridge according to claim 1, wherein the resistance behaviour of each resistor arrangement R1, R2, R3, R4 have identical magnitude.

3. Wheatstone bridge according to claim 1, wherein the resistor arrangements are AMR, GMR, or TMR resistor arrangements, which are arranged on a chip substrate.

4. A Wheatstone bridge according to claim 1, wherein each resistor arrangement R1, R2, R3, R4 comprises a magnetoresistive resistor with a preferred direction, wherein the preferred directions of diagonal opposing resistor arrangements of the bridge branches R1 and R4 or R2 and R3 differ by an angle $\alpha$ from one another, by an angle $\alpha=60°$.

5. Wheatstone bridge according to claim 1, wherein each resistor arrangement R1, R2, R3, R4 comprises at least two magnetoresistive resistors RX1, RX2 with preferred directions offset relative to one another by an angle $\alpha2$ or by further angles, wherein the resultant preferred directions of diagonally opposing resistor arrangements of the bridge branches R1 and R4 or R2 and R3 differ from one another by an angle $\alpha1$, wherein $\alpha1=60°$ and $\alpha2=30°$ or $\alpha2=36°$.

6. Wheatstone bridge according to claim 1, wherein at least in a resistor arrangement R1, R2, R3 or R4, a trimming resistor RXT is series-connected which is selected so as to result in a resistance behaviour identical with regard to magnitude of the resistor arrangements R1, R2, R3 and R4.

7. Wheatstone bridge according to claim 1, wherein the trimming resistor is a magnetoresistive resistor which has a trimming resistor preferred direction.

8. Wheatstone bridge according to claim 7, wherein the trimming resistor preferred direction is orientable in the direction of a preferred direction of one resistor of the resistor arrangement, in the direction of the resultant preferred direction of the resistor arrangement or in the direction of the overall preferred direction of the Wheatstone bridge.

9. Wheatstone bridge according to claim 6, wherein the trimming resistor comprises a concatenation of at least two tunnel resistors between top electrodes and bottom electrodes, wherein the trimming resistor is adjustable by electrode interruption or electrode short-circuit of the top electrode or of the bottom electrode.

10. Wheatstone bridge according to claim 6, wherein the trimming resistor comprises a plurality of tunnel resistors, wherein the number of parallel branches and/or series resistors of each parallel branch is adjustable.

11. Magnetoresistive Wheatstone bridge comprising two bridge branches connected in parallel between a supply potential Vb, two series-connected resistor arrangements R1 and R3 or R2 and R4 arranged in each bridge branch with an interposed measuring potential Vout, and the resistor arrangements R1 and R4 or R2 and R3 of the two bridge branches being diagonally opposite and at least two magnetoresistive resistor arrangements R1, R2, R3, R4 having a magnetically sensitive preferred direction, the preferred directions of diagonally opposing magnetoresistive resistor arrangements of the bridge branches R1 and R4 or R2 and R3 differing from one another by an angle other than 0° or 180, wherein the preferred directions of the series-connected resistor arrangements R1 and R3 or R2 and R4 of each bridge branch are oriented antiparallel, or the preferred directions of the resistor arrangements R1 and R2 or R3 and R4 situated opposite one another in pairs in the bridge branches are oriented nonparallel;

an angle sensor, wherein the angle sensor comprises at least two magnetoresistive Wheatstone bridges offset by 90°, according to claim 1, for determining an angular orientation of a magnetic field by a sine bridge and a cosine bridge.

12. Wheatstone bridge according to claim 11, wherein resistor arrangements RX1, RX2 of the first bridge branch R1R3 of the first sensor bridge and the second sensor bridge are arranged spatially adjacently on a chip substrate, and resistor arrangements RX1, RX2 of the second bridge branch R2R4 of the first sensor bridge and of the second sensor bridge are arranged spatially adjacently on the chip substrate, and the first and second bridge branches R1-R3 and R2-R4 are arranged diagonally relative to one another on the chip substrate.

* * * * *